United States Patent
Liu et al.

(10) Patent No.: US 12,457,734 B2
(45) Date of Patent: Oct. 28, 2025

(54) TWO TRANSISTOR CELLS FOR VERTICAL THREE-DIMENSIONAL MEMORY

(71) Applicant: Micron Technology, Inc., Boise, ID (US)

(72) Inventors: Haitao Liu, Boise, ID (US); Litao Yang, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 537 days.

(21) Appl. No.: 17/515,782

(22) Filed: Nov. 1, 2021

(65) Prior Publication Data

US 2023/0138620 A1    May 4, 2023

(51) Int. Cl.
*H10B 41/20* (2023.01)
*H01L 21/02* (2006.01)
*H10D 84/01* (2025.01)
*H10D 84/03* (2025.01)

(52) U.S. Cl.
CPC ....... *H10B 41/20* (2023.02); *H01L 21/02164* (2013.01); *H01L 21/0228* (2013.01); *H10D 84/0133* (2025.01); *H10D 84/038* (2025.01)

(58) Field of Classification Search
CPC .......... H10B 41/20; H10B 12/20; H01L 21/02164; H01L 21/0228; H01L 21/823425; H10D 84/0133; H10D 84/038; H10D 88/00
See application file for complete search history.

(56) References Cited

U.S. PATENT DOCUMENTS

| | | | |
|---|---|---|---|
| 10,607,995 B2 | 3/2020 | Roberts et al. | |
| 2007/0296034 A1* | 12/2007 | Chen | H10B 69/00 257/E27.103 |
| 2018/0323200 A1 | 11/2018 | Tang et al. | |
| 2019/0074363 A1* | 3/2019 | Zhu | H10B 41/27 |
| 2019/0103406 A1 | 4/2019 | Tang et al. | |
| 2019/0164985 A1* | 5/2019 | Lee | H01L 23/53295 |
| 2020/0020402 A1* | 1/2020 | Lee | H10B 43/27 |
| 2020/0176465 A1 | 6/2020 | Tang et al. | |

(Continued)

OTHER PUBLICATIONS

Koji Sakui, Nozumu Harada, Dynamic Flash Memory with Dual Gate Surrounding Gate Transistor (SGT), 2021 IEEE International Memory Workshop (IMW) Sep. 20, 2021, 4 pages, Unisantis Electronics Singapore Pte Ltd., 03-17A, The Alpha Singapore Science Park II, Singapore.

(Continued)

*Primary Examiner* — William B Partridge
*Assistant Examiner* — David Paul Sedorook
(74) *Attorney, Agent, or Firm* — Brooks, Cameron & Huebsch, PLLC

(57) ABSTRACT

Systems, methods and apparatus are provided for two transistor cells for vertical three-dimensional memory. The memory has serially connected horizontally oriented transistors each having an independent first source/drain region and a shared second source/drain region separated by channel regions, and gates opposing the channel regions and separated therefrom by a gate dielectric;
pairs of vertically oriented access lines coupled to the gates and separated from the channel region by the gate dielectric; and horizontally oriented digit lines electrically coupled to the first source/drain regions of the horizontally oriented transistors.

21 Claims, 22 Drawing Sheets

(56) References Cited

U.S. PATENT DOCUMENTS

2020/0211615 A1\* 7/2020 Sarpatwari ............ G11C 11/409
2021/0375344 A1\* 12/2021 Young ................ G11C 11/2275

OTHER PUBLICATIONS

Md Hasan Raza Ansari, Jawar Singh, Capacitorless 2T-DRAM for Higher Retention Time and Sense Margin, IEEE Transactions on electron Devices, Mar. 2020, 5 pages, vol. 67, No. 3.

\* cited by examiner

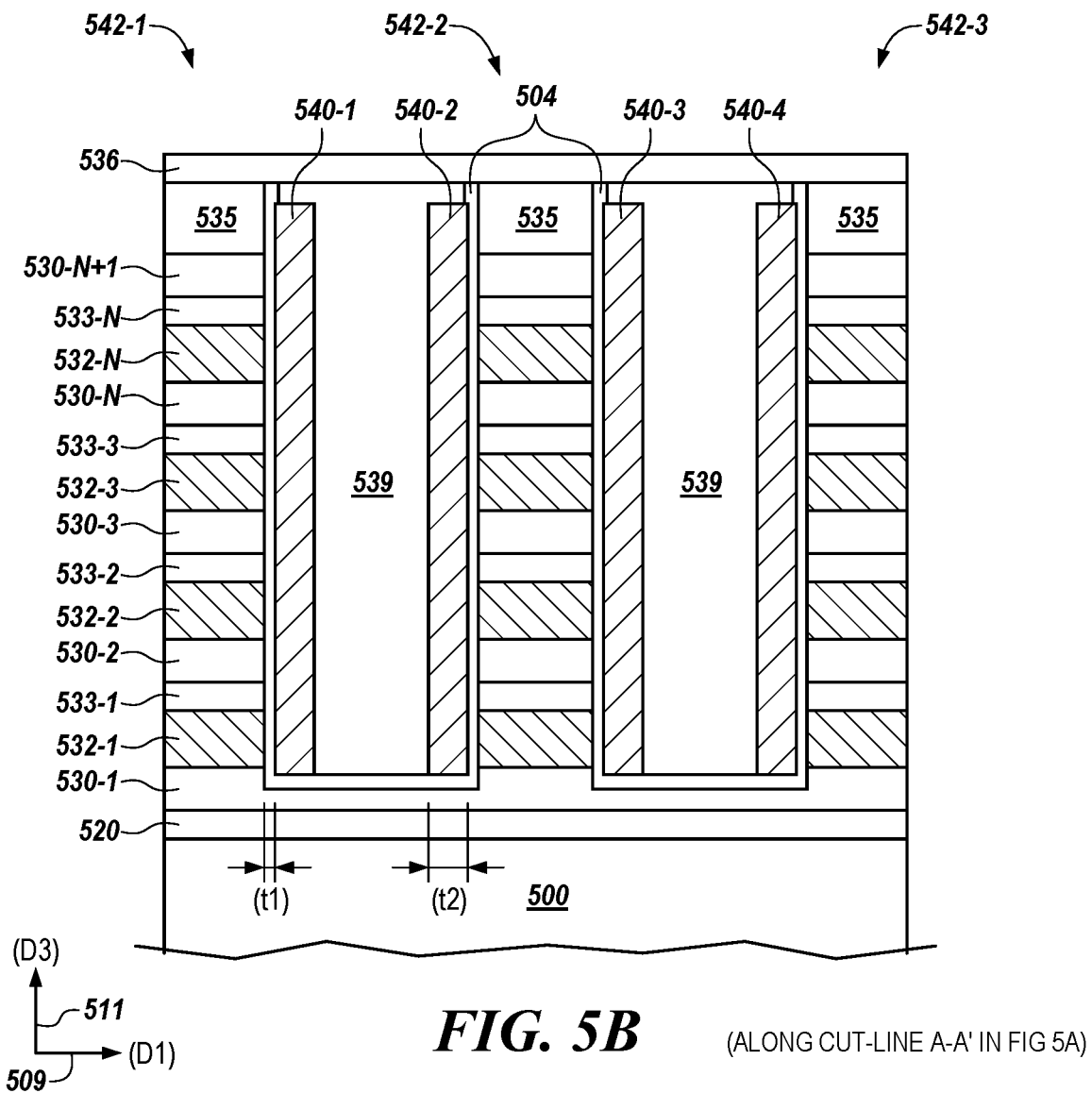
FIG. 5B (ALONG CUT-LINE A-A' IN FIG 5A)

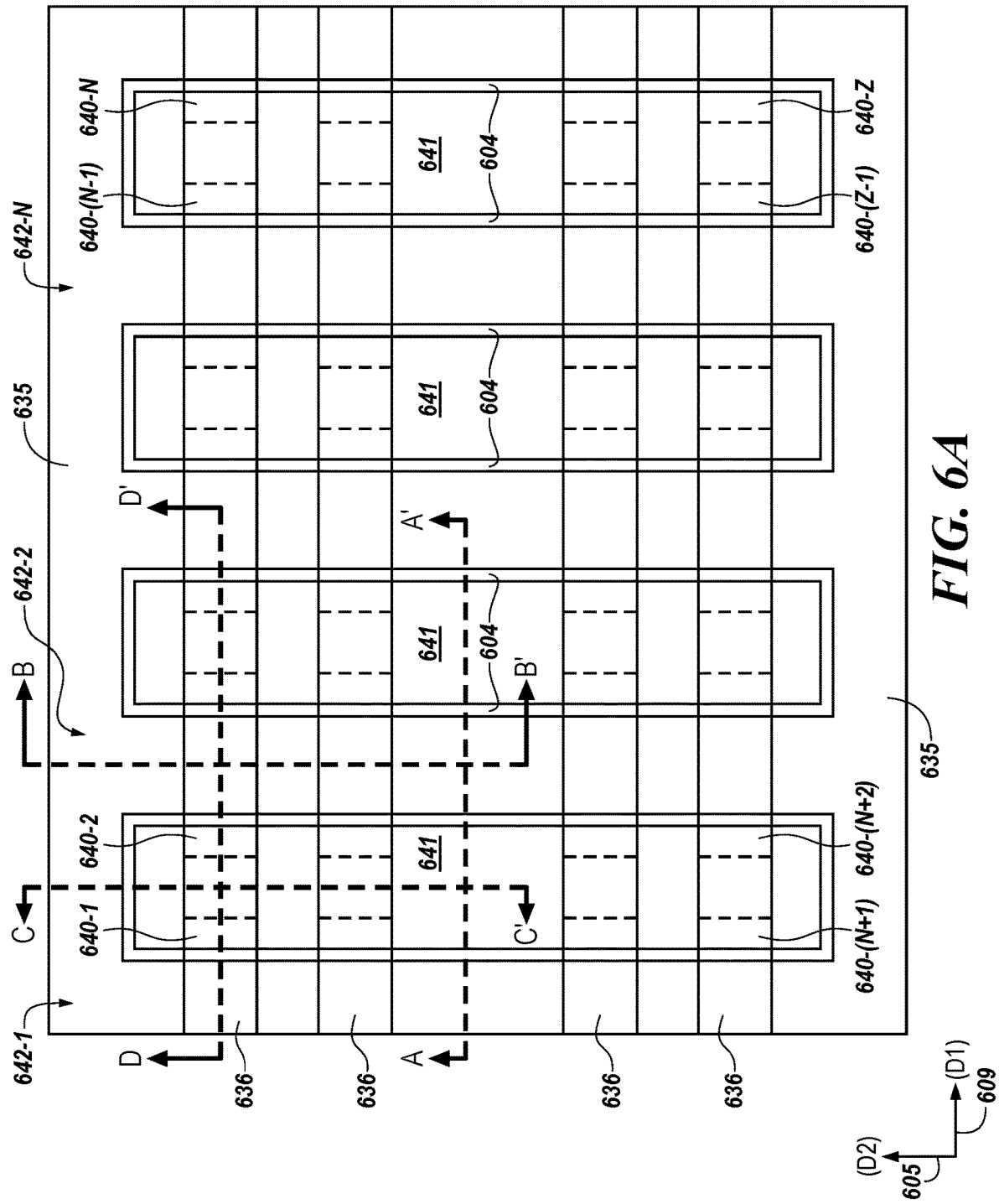

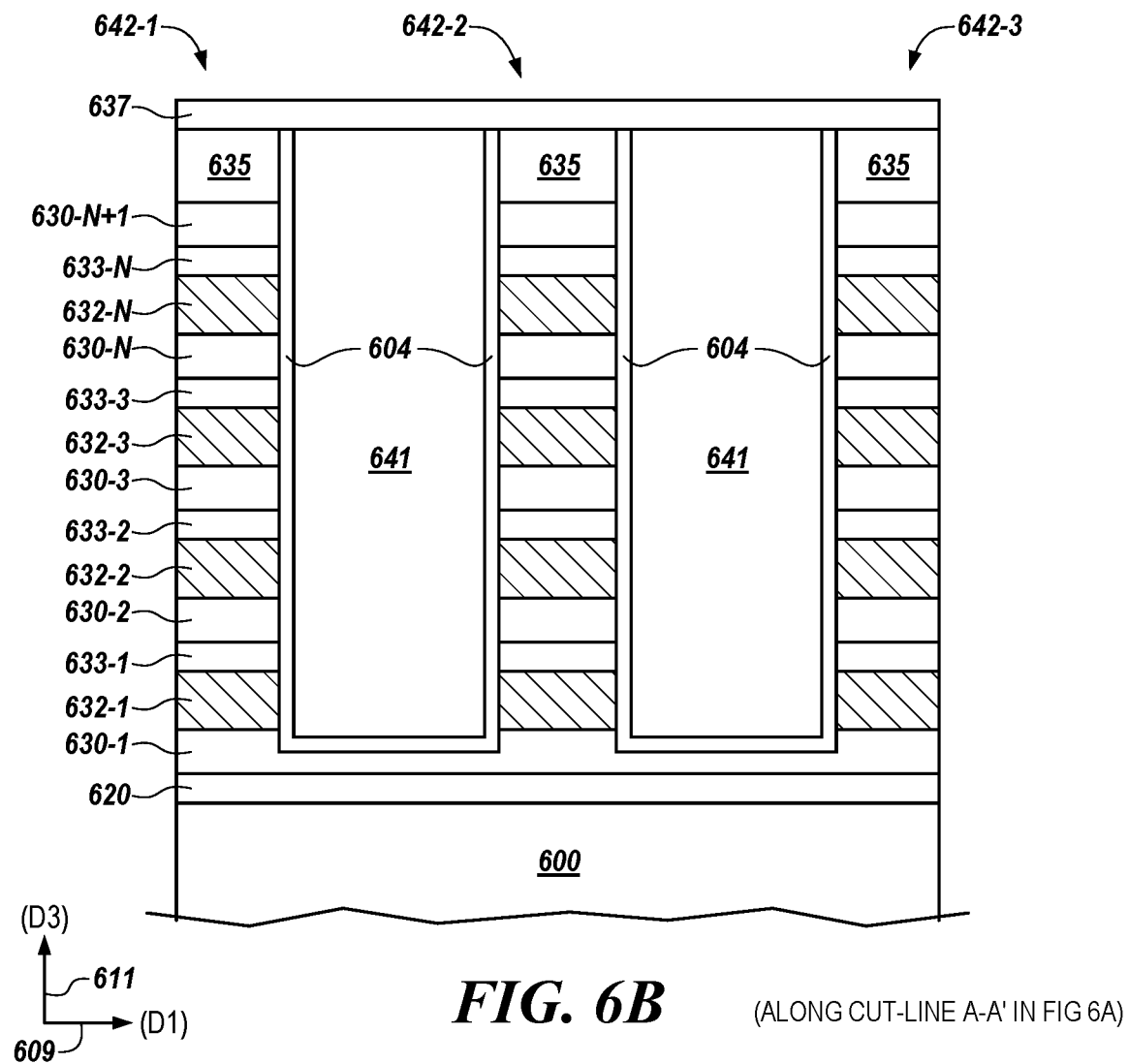
FIG. 6B (ALONG CUT-LINE A-A' IN FIG 6A)

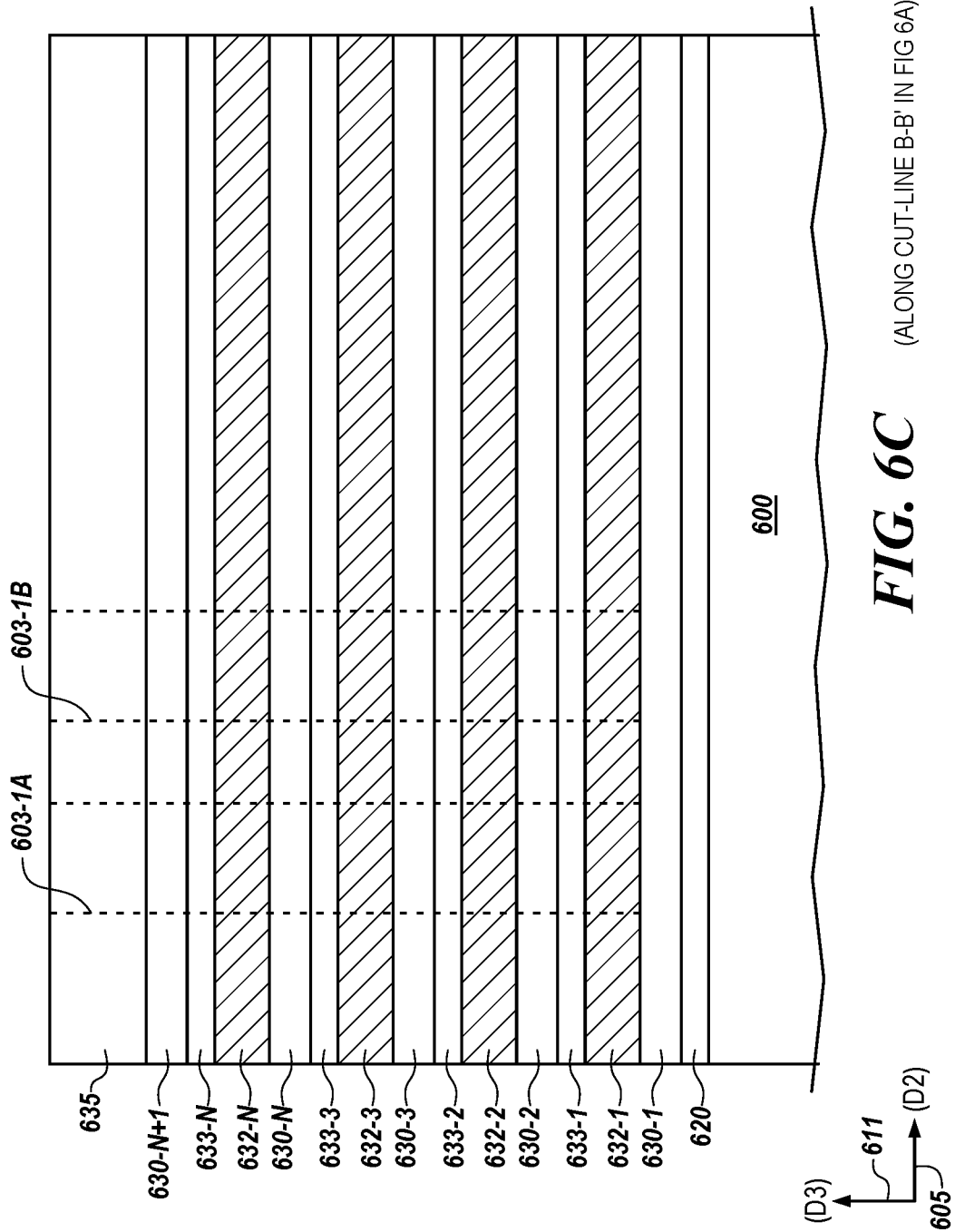
FIG. 6C (ALONG CUT-LINE B-B' IN FIG 6A)

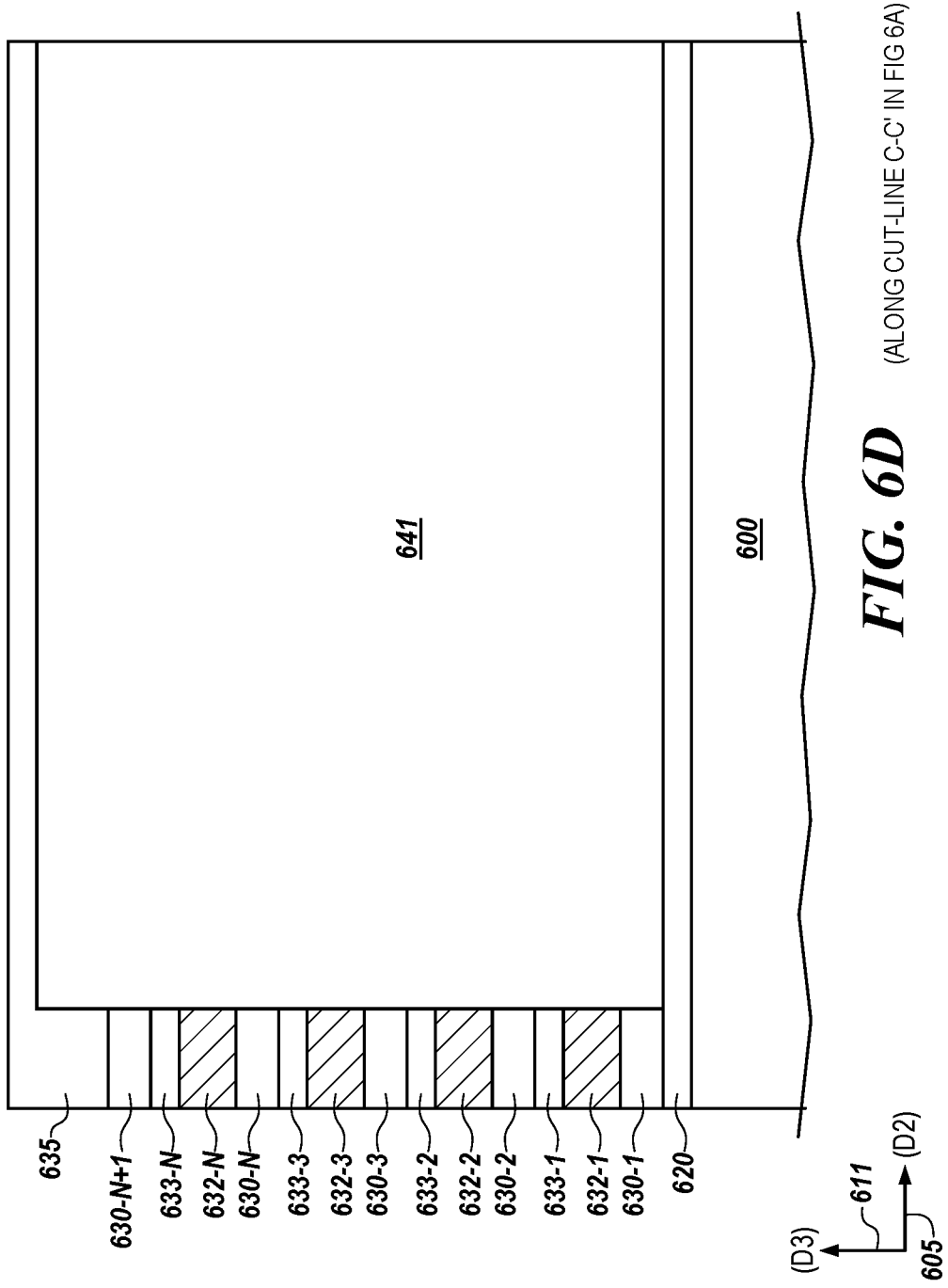
FIG. 6D (ALONG CUT-LINE C-C' IN FIG 6A)

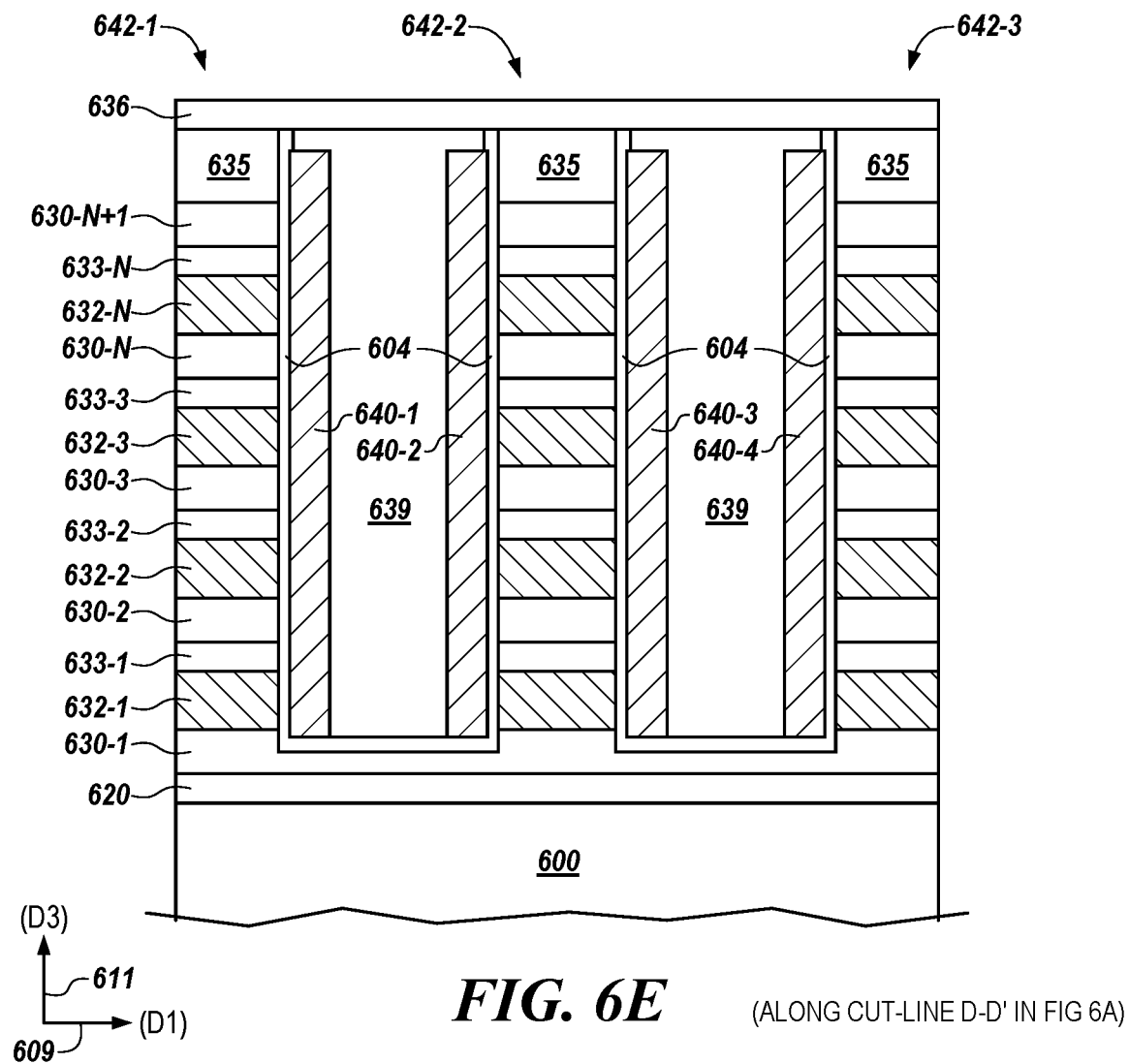
FIG. 6E (ALONG CUT-LINE D-D' IN FIG 6A)

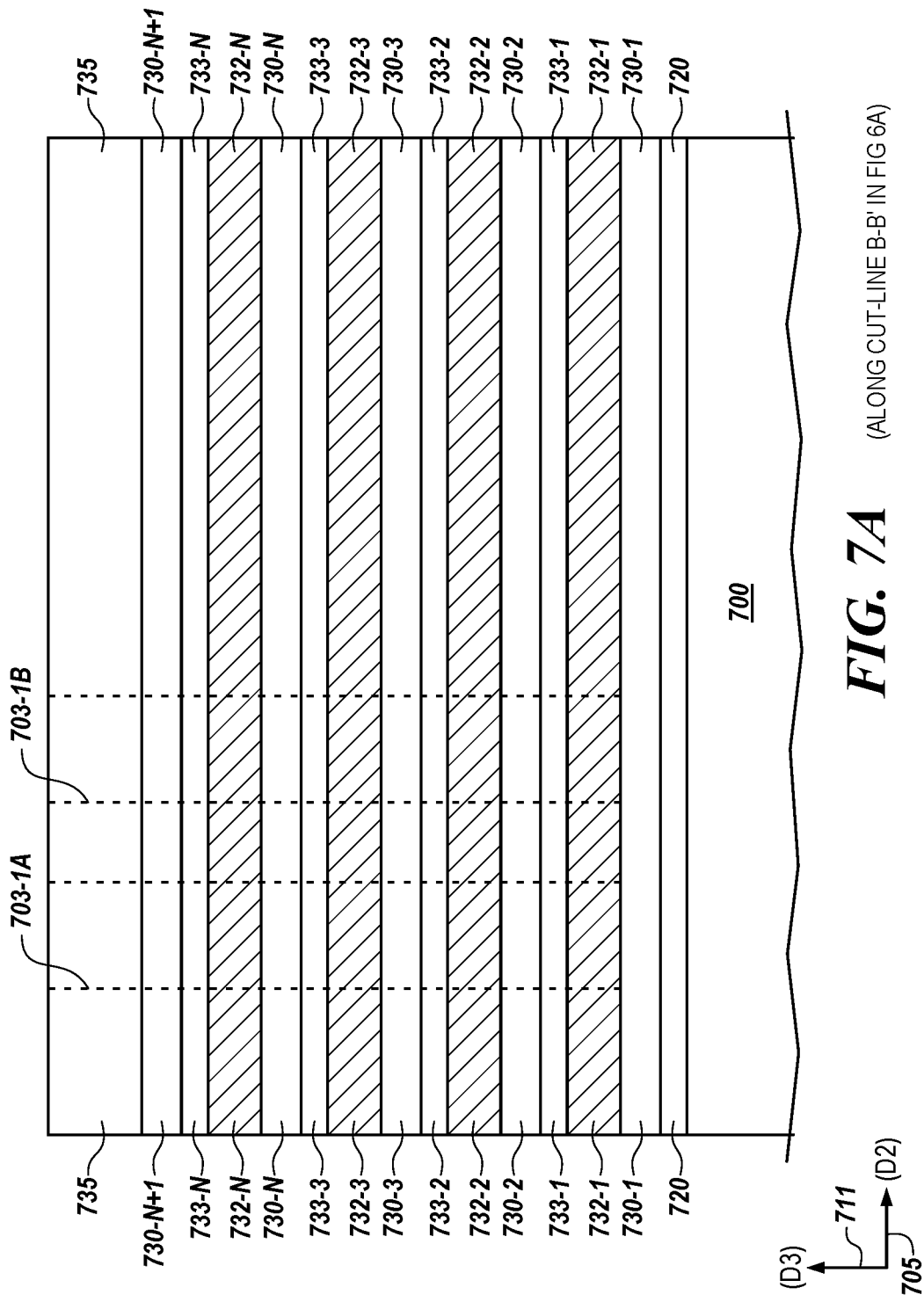
FIG. 7A (ALONG CUT-LINE B-B' IN FIG 6A)

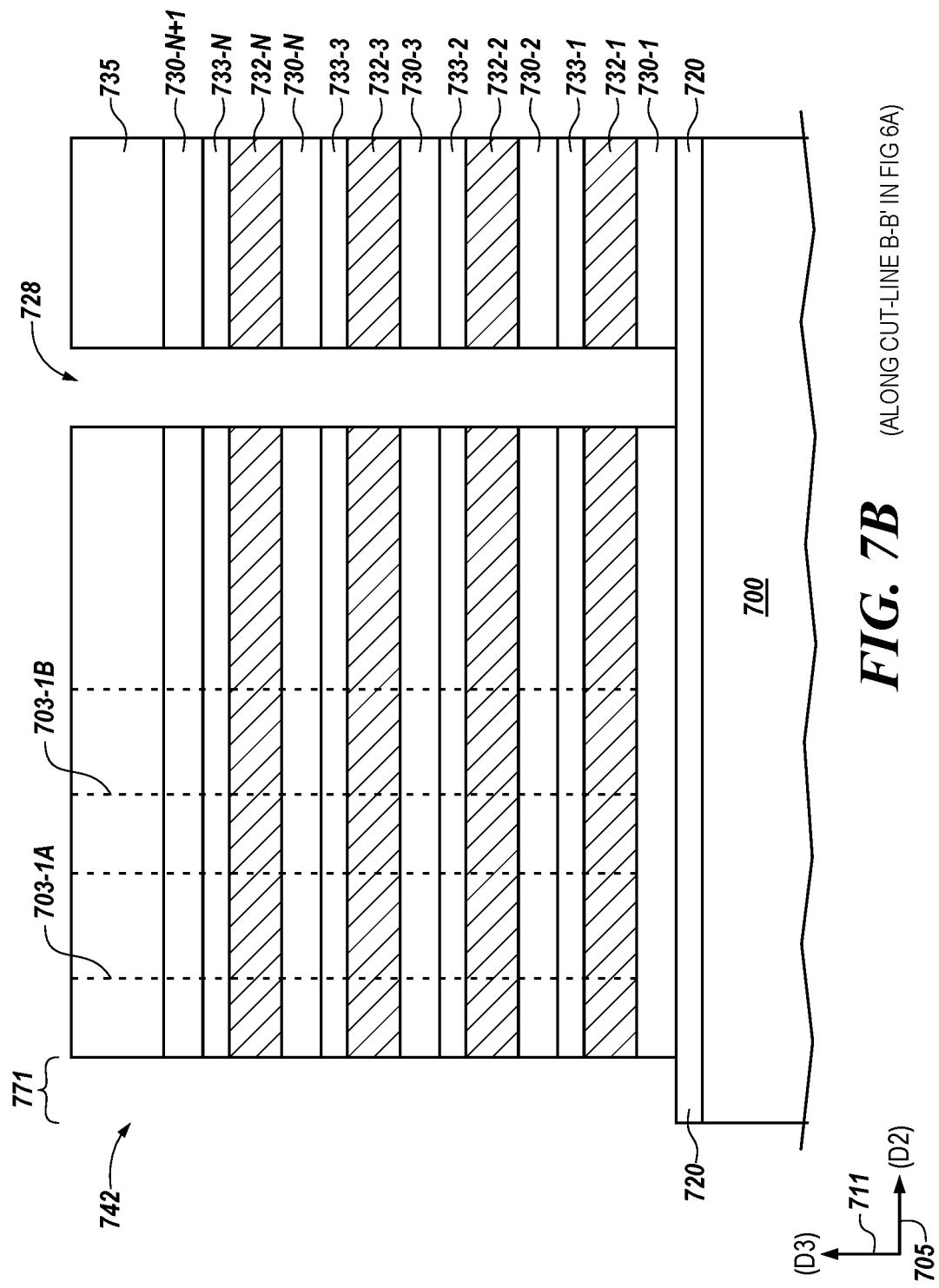
FIG. 7B (ALONG CUT-LINE B-B' IN FIG 6A)

TWO TRANSISTOR CELLS FOR VERTICAL THREE-DIMENSIONAL MEMORY

TECHNICAL FIELD

The present disclosure relates generally to memory devices, and more particularly, to two transistor cells for vertical three-dimensional memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like. Memory devices can be utilized for a wide range of electronic applications.

BRIEF DESCRIPTION OF THE DRAWINGS

FIG. 5B is a cross sectional view, taken along cut-line A-A' in FIG. 5A.

FIG. 6A is a view of a semiconductor device in fabrication, at one stage of a semiconductor device fabrication process in accordance with a number of embodiments of the present disclosure.

FIG. 6B illustrates a cross sectional view, taken along cut-line A-A' in FIG. 6A.

FIG. 6C illustrates a cross sectional view, taken along cut-line B-B' in FIG. 6A.

FIG. 6D illustrates a cross sectional view, taken along cut-line C-C' in FIG. 6A.

FIG. 6E illustrates a cross sectional view, taken along cut-line D-D' in FIG. 6A.

FIG. 7A illustrates a cross sectional view, taken along cut-line B-B' in FIG. 6A.

FIG. 7B illustrates a cross sectional view, taken along cut-line A-A' in FIG. 6A.

DETAILED DESCRIPTION

Figure 1A:
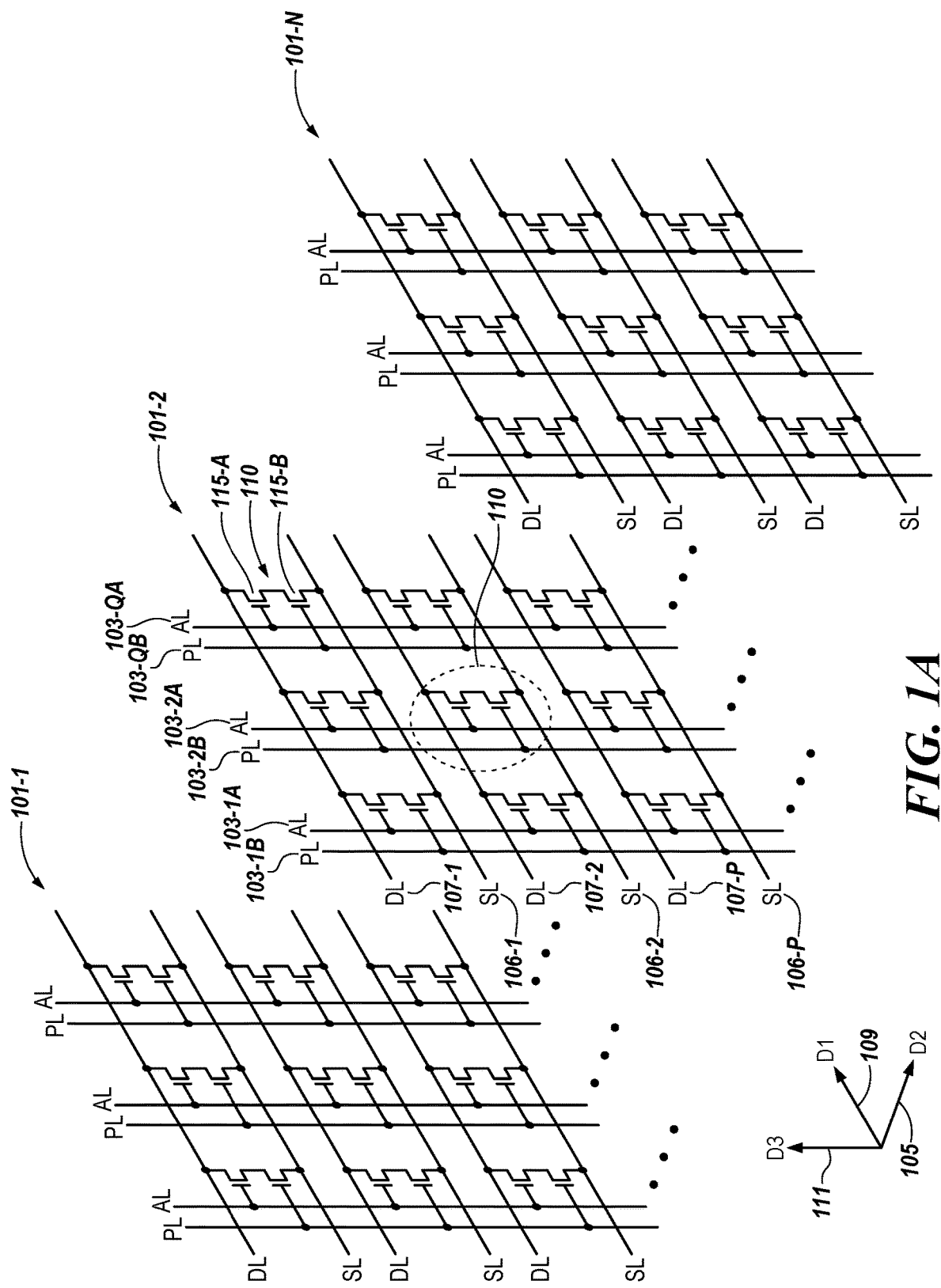
FIG. 1A is a schematic illustration of a portion of a vertical three-dimensional (3D) memory in accordance a number of embodiments of the present disclosure.

Embodiments of the present disclosure describe two transistor cells for vertical three-dimensional (3D) memory. The two transistor (2T) cells are capacitorless. The transistors are horizontally oriented and each of the cells include a shared source/drain region. The horizontally oriented transistors are integrated with vertically oriented access lines and integrated with horizontally oriented digit lines. This provides good retention and scalability, in part due to the lack of storage capacitors for the memory cells, for vertical three-dimensional memories.

The figures herein follow a numbering convention in which the first digit or digits correspond to the figure number of the drawing and the remaining digits identify an element or component in the drawing. Similar elements or components between different figures may be identified by the use of similar digits. For example, reference numeral 223 may reference element "23" in FIG. 2, and a similar element may be referenced as 323 in FIG. 3. Multiple analogous elements within one figure may be referenced with a reference numeral followed by a hyphen and another numeral or a letter. For example, 207-1 may reference element 207-1 in FIGS. 2 and 207-2 may reference element 207-2, which may be analogous to element 207-1. Such analogous elements may be generally referenced without the hyphen and extra numeral or letter. For example, elements 207-1 and 207-2 or other analogous elements may be generally referenced as 207.

FIG. 1A is a schematic illustration of a portion of a vertical 3D memory in accordance a number of embodiments of the present disclosure. FIG. 1A illustrates a circuit diagram showing a cell array of a 3D semiconductor memory device according to embodiments of the present disclosure. FIG. 1A illustrates a cell array may have a plurality of sub cell arrays 101-1, 101-2, ..., 101-N. The sub cell arrays 101-1, 101-2, ..., 101-N may be arranged along a second direction (D2) 105. Each of the sub cell arrays, e.g., sub cell array 101-2, may include a plurality of pairs of access lines 103-1A and 103-1B, 103-2A and 103-2B, ..., 103-QA and 103-QB (103A access lines (e.g., "AL" as illustrated in FIG. 1A) may be referred to as wordlines and 103B access lines may be referred to as platelines (e.g., "PL" as illustrated in FIG. 1A). Each of the sub cell arrays may include a plurality of digit lines 107-1, 107-2, . . . , 107-P (which also may be referred to as bitlines, data lines, or sense lines). Each of the sub cell arrays may include one or more source lines 106-1, 106-2, . . . , 106-P. In FIG. 1A, the digit lines 107-1, 107-2, . . . , 107-P and the source lines 106-1, 106-2, . . . , 106-P are illustrated extending in a first direction (D1) 109, while the pairs of access lines 103-1A and 103-1B, 103-2A and 103-2B, . . . , 103-QA and 103-QB are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the pairs of access lines 103-1A and 103-1B, 103-2A and 103-2B, . . . , 103-QA and 103QB are extending in a vertical direction, e.g., third direction (D3) 111.

A memory cell (e.g., 110) may include two transistors 115-A and 115-B located at intersections of the pairs of access lines 103-1A and 103-1B, 103-2A and 103-2B, . . . , 103-QA and 103-QA and the digit lines 107-1, 107-2, . . . , 107-P and source lines 106-1, 106-2, . . . , 106-P.

Memory cells may be written to, or read from, using the pairs of access lines 103-1A and 103-1B, 103-2A and 103-2B, . . . , 103-QA and 103-QA, the digit lines 107-1, 107-2, . . . , 107-P, and/or the source lines 106-1, 106-2, . . . , 106-P. The digit lines 107-1, 107-2, . . . , 107-P may conductively interconnect memory cells along horizontal columns of each sub cell array 101-, 101-2, . . . , 101-N, and the access lines 103-1A and 103-1B, 103-2A and 103-2B, . . . , 103-QA and 103-QA may conductively interconnect memory cells along vertical rows of each sub cell array 101-, 101-2, . . . , 101-N. Each memory cell may be uniquely addressed through a combination of an access line pair 103-1A and 103-1B, 103-2A and 103-2B, . . . , 103-QA, a digit line 107-1, 107-2, . . . , 107-P, and/or a source line 106-1, 106-2, . . . , 106-P.

The digit lines 107-1, 107-2, . . . , 107-P and the source lines 106-1, 106-2, . . . , 106-P may be or include conducting patterns (e.g., metal lines) disposed on and spaced apart from a substrate. The digit lines 107-1, 107-2, . . . , 107-P and the source lines 106-1, 106-2, . . . , 106-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111. Similarly, the source lines 106-1, 106-2, . . . , 106-P in one sub cell array may be spaced apart from each other in the vertical direction.

The access line pairs 103-1A and 103-1B, 103-2A and 103-2B, . . . , 103-QA may be or include conductive patterns (e.g., metal lines) extending in a vertical direction with respect to the substrate (e.g., in a third direction (D3) 111. The access lines in one sub cell array (e.g., 101-2) may be spaced apart from each other in the first direction (D1) 109.

The gates of a memory cell (e.g., memory cell 110) may respectively be connected to each of an access line pair (e.g., 103-2A and 103-2B) and a first conductive node (e.g., a source/drain region) of a first transistor 115-A of the memory cell 110 may be connected to a digit line (e.g., 107-2) while another conductive node of a second transistor 103-B may be connected to a source line (e.g., 106-2).

Figure 1B:
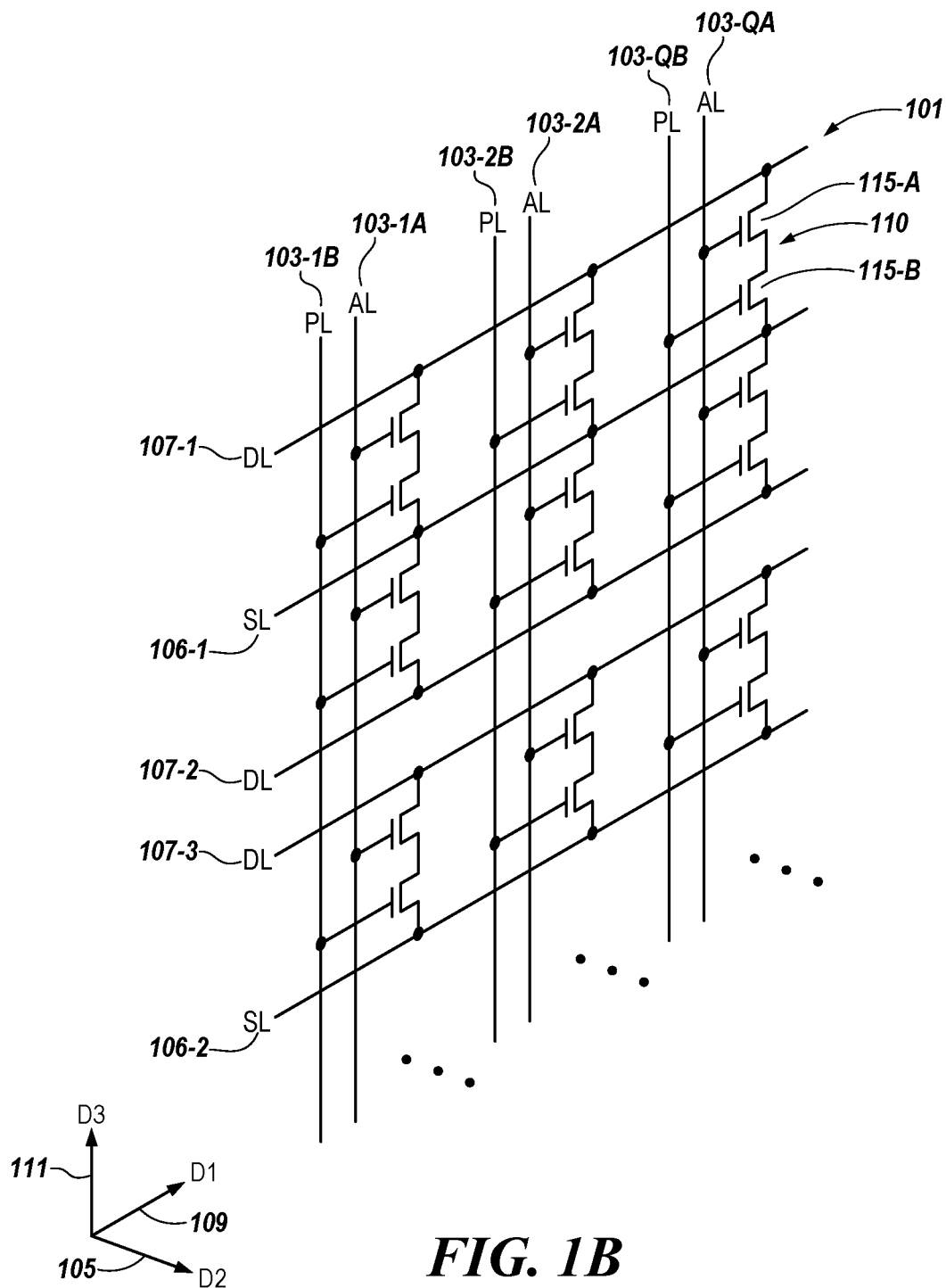
FIG. 1B is a schematic illustration of a portion of a vertical 3D memory in accordance a number of embodiments of the present disclosure.

FIG. 1B is a schematic illustration of a portion of a vertical 3D memory in accordance a number of embodiments of the present disclosure. As shown in FIG. 1B, source line (e.g., source line 106-1) can be common to memory cells coupled to different digit lines (e.g., digit lines 107-1, 107-2). For instance, as shown in FIG. 1B, both the memory cells coupled to digit line 107-1 and the memory cells coupled to digit line 107-2 are coupled to source line 106-1.

Figure 2:
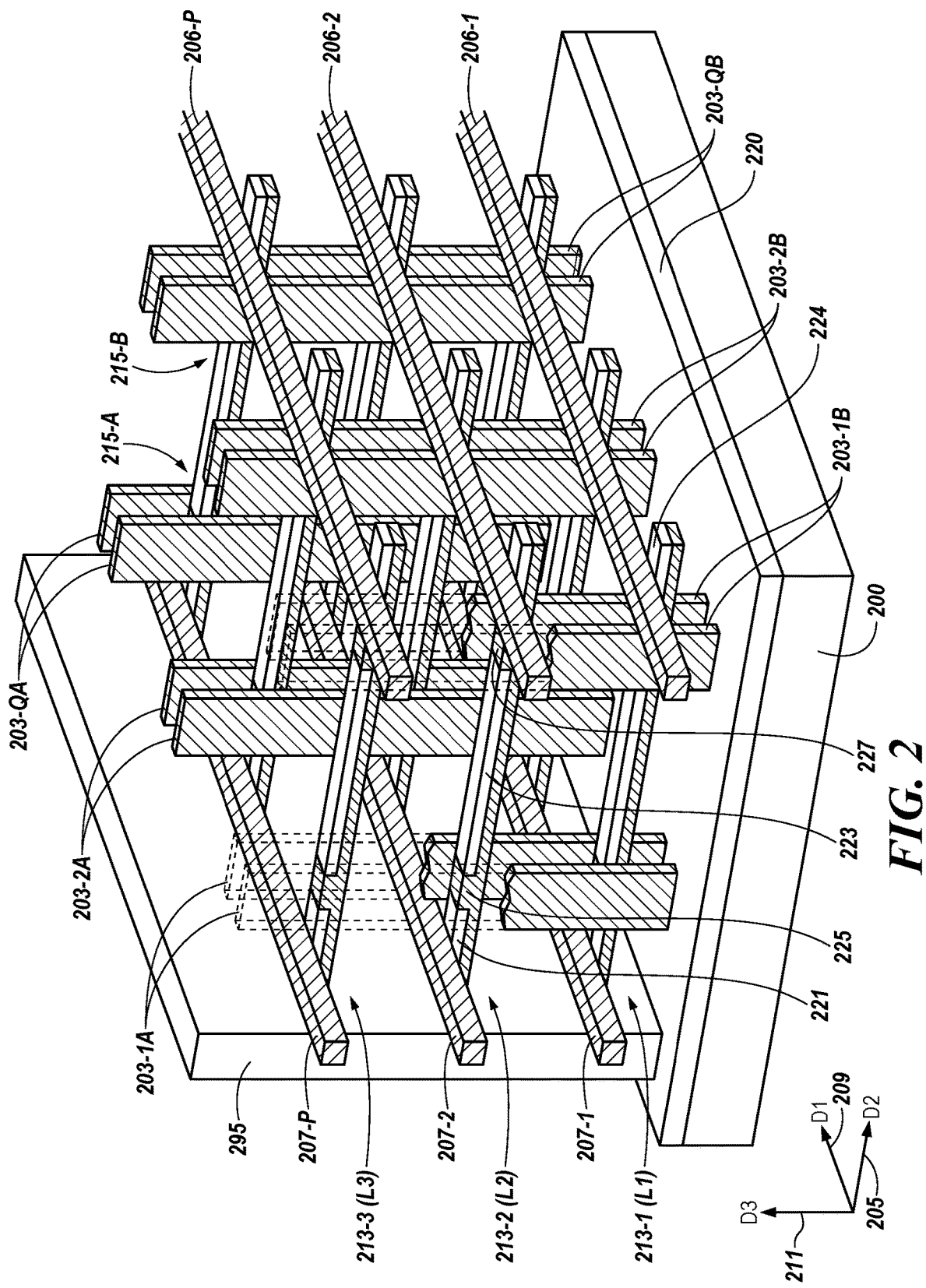
FIG. 2 is a perspective view illustrating a portion of a semiconductor device in accordance with a number of embodiments of the present disclosure.

FIG. 2 is a perspective view illustrating a portion of a semiconductor device in accordance with a number of embodiments of the present disclosure. FIG. 2 illustrates a perspective view showing a 3D semiconductor memory device (e.g., a portion of a sub cell array 101-2 shown in FIG. 1A) as a vertically oriented stack of memory cells in an array, according to some embodiments of the present disclosure.

As shown in FIG. 2, a substrate 200 may have formed thereon one of the plurality of sub cell arrays (e.g., 101-2 described in connection with FIG. 1A). For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells extending in a vertical direction, e.g., third direction (D3) 211. According to some embodiments the vertically oriented stack of memory cells may be fabricated such that the memory cells are formed on plurality of vertical levels (e.g., a first level 213-1 (L1), a second level 213-2 (L2), and a third level 213-3 (L3)). The repeating, vertical levels, L1, L2, and L3, may be arranged (e.g., "stacked"), the vertical direction (D3) 211, and may be separated from the substrate 200 by an insulator material 220. Each of the repeating, vertical levels, L1, L2, and L3 may include a number of components, e.g., regions, to the horizontally oriented transistors 215A, 215-B, including access line pairs 203-1A/203-1-B, 203-2A/203-2B, . . . , 203-QA/203-QB connections, digit line 207-1, 207-2, . . . , 207-P connections, and source line 206-1, 206-2, . . . , 206-P connections. The number of components to the horizontally oriented transistors 215-A and 215-B may be formed in a plurality of iterations of vertically, repeating layers within each level (e.g., as described in more detail below in connection with FIG. 4) and may extend horizontally in the second direction (D2) 205, analogous to second direction (D2) 105 shown in FIG. 1A.

The horizontally oriented transistor 215-A can include a include a first source/drain region 221 and a shared source/drain region 223 separated by a channel region 225. The shared source/drain region 223 is shared (e.g., is common to both transistors) by transistor 215-A and transistor 215-B. The components of transistor 215-A extend laterally (e.g., horizontally) in the second direction (D2) 205.

The horizontally oriented transistor 215-B can include a include a first source/drain region 224 and the shared source/drain region 223 separated by a channel region 227. The components of transistor 215-B extend laterally (e.g., horizontally) in the second direction (D2) 205.

In some embodiments, the channel regions 225, 227 may include silicon, germanium, silicon-germanium, and/or indium gallium zinc oxide (IGZO). In some embodiments, the source/drain regions, 221, 223, 224 can include an n-type dopant region formed in a p-type doped body to the transistor to form an n-type conductivity transistor. In some embodiments, the source/drain regions, 221, 223, 224 may include a p-type dopant formed within an n-type doped body to the transistor to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

As shown in FIG. 2, a plurality of horizontally oriented digit lines 207-1, 207-2, . . . , 207-P extend in the first direction (D1) 209, analogous to the first direction (D1) 109 in FIG. 1A. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the horizontally oriented memory cells, e.g., memory cell 110 in FIG. 1A, may be spaced apart from one another horizontally in the first direction (D1) 209. However, the number of components to the transistors 215-A, e.g., first source/drain region 221 and shared source/drain region 223 separated by the channel region 225, and the plurality of horizontally oriented digit lines 207-1, 207-2, . . . , 207-P may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to the horizontally oriented transistors 215-A, which extend in laterally in the second direction (D2) 205. In some embodiments, the plurality of horizontally oriented digit lines 207-1, 207-2, . . . , 207-P are formed in a higher vertical layer, farther from the substrate 200, within a level, e.g., within level (L1), than a layer in which the components, e.g., first source/drain region 221 and shared source/drain region 223 separated by the channel region 225, of the transistor 215-A are formed. In some embodiments, the plurality of horizontally oriented digit lines 207-1, 207-2, . . . , 207-P may be connected to the top surfaces of the first source/drain regions 221 directly and/or through additional contacts including metal silicides.

As shown in FIG. 2, a plurality of horizontally oriented source lines 206-1, 206-2, . . . , 206-P extend in the first direction (D1) 209, analogous to the first direction (D1) 109 in FIG. 1A. The plurality of horizontally oriented source lines 206-1, 206-2, . . . , 206-P may be arranged, e.g., "stacked", along the third direction (D3) 211. The plurality of horizontally oriented source lines 206-1, 206-2, . . . , 206-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

The number of components to the transistors 215-B, e.g., first source/drain region 224 and shared source/drain region 223 separated by the channel region 227, and the plurality of horizontally oriented source lines 206-1, 206-2, . . . , 206-P may be formed within different vertical layers within each level. For example, the plurality of horizontally oriented source lines 206-1, 206-2, . . . , 206-P, extending in the first direction (D1) 209, may be disposed on, and in electrical contact with, top surfaces of first source/drain regions 224 and orthogonal to the horizontally oriented transistors 215-B, which extend in laterally in the second direction (D2) 205. In some embodiments, the plurality of horizontally oriented source lines 206-1, 206-2, . . . , 206-P are formed in a higher vertical layer, farther from the substrate 200, within a level, e.g., within level (L1), than a layer in which the components, e.g., first source/drain region 224 and shared source/drain region 223 separated by the channel region 227, of the transistor 215-B are formed. In some embodiments, the plurality of horizontally oriented source lines 206-1, 206-2, . . . , 206-P may be connected to the top surfaces of the first source/drain regions 224 directly and/or through additional contacts including metal silicides.

As shown in the example embodiment of FIG. 2, the access lines, 203-1A, 203-1B, 203-2A, 203-2B . . . , 203-QA, 203-QB extend in a vertical direction with respect to the substrate 200, e.g., in a third direction (D3) 211. Further, as shown in FIG. 2, the access lines, 203-1A, 203-1B, 203-2A, 203-2B . . . , 203-QA, 203-QB, in one sub cell array, e.g., sub cell array 101-2 in FIG. 1A, may be spaced apart from each other in the first direction (D1) 209. The access lines, 203-1A, 203-1B, 203-2A, 203-2B . . . , 203-QA, 203-QB, may be provided, extending vertically relative to the substrate 200 in the third direction (D3) 211 between a pair of the laterally oriented transistors 215-A, 215-B extending laterally in the second direction (D2) 205, but adjacent to each other on a level, e.g., first level (L1), in the first direction (D1) 209. Each of the access lines, 203-1A, 203-1B, 203-2A, 203-2B . . . , 203-QA, 203-QB, may vertically extend, in the third direction (D3), on sidewalls of respective ones of the plurality of horizontally oriented transistors 215-A, 215-B, which are vertically stacked.

Figure 3:
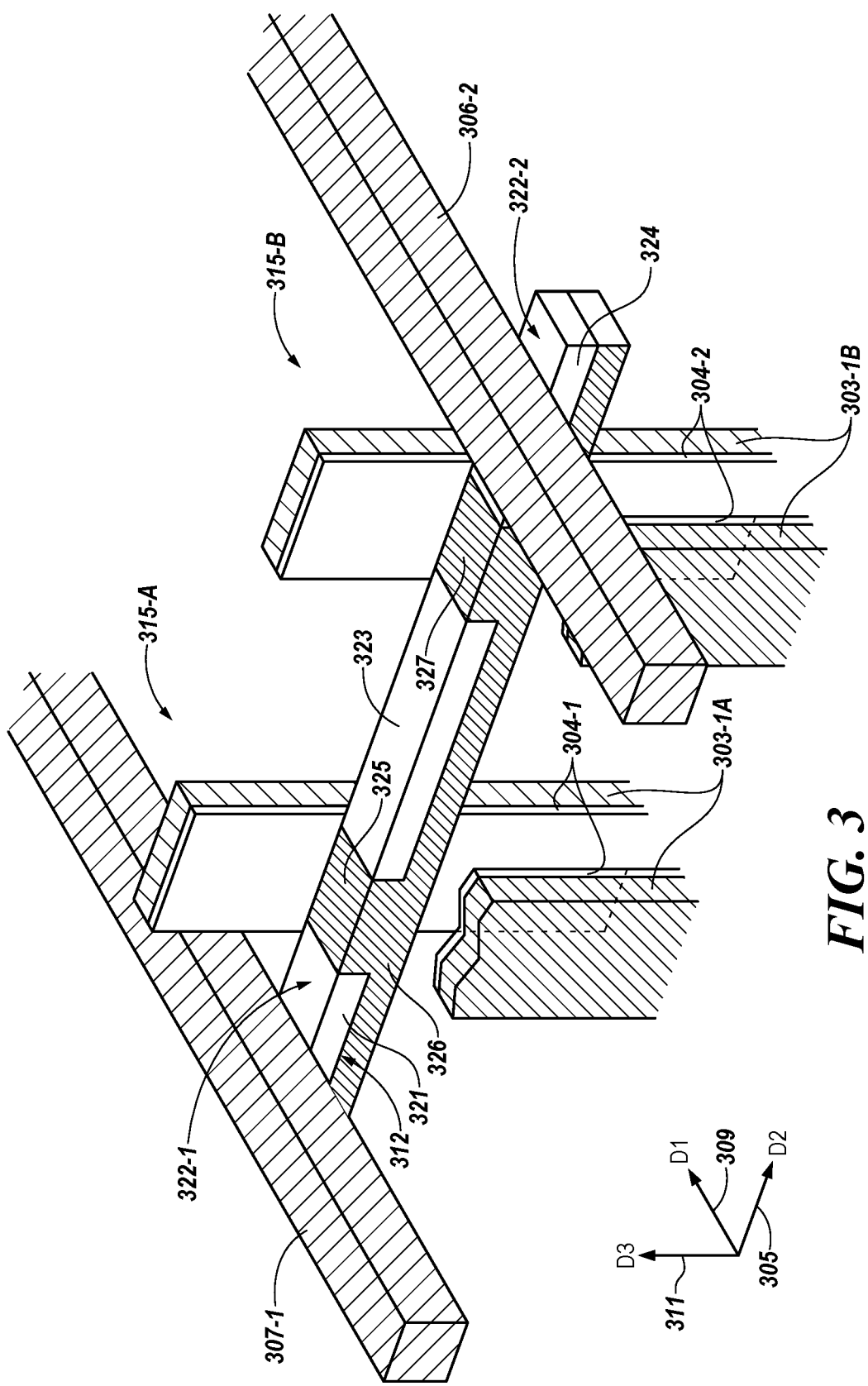
FIG. 3 is a perspective view illustrating a portion of a semiconductor device in accordance with a number of embodiments of the present disclosure.

For example, and as shown in more detail in FIG. 3, a first one of the vertically extending access lines, e.g., 203-1A, may be adjacent a sidewall of a channel region 225 to one of the transistors 215-A, in the first level (L1) 213-1, a sidewall of a channel region 225 of another one of the transistors 215-A in the second level (L2) 213-2, and a sidewall of a channel region 225 a another one oriented of the transistors 215-A in the third level (L3) 213-P, etc. Embodiments are not limited to a particular number of levels.

The vertically extending access lines, 203-1A, 203-1B, 203-2A, 203-2B . . . , 203-QA, 203-QB, may include a conductive material, such as, for example, one of a doped semiconductor material, a conductive metal nitride, metal, and/or a metal-semiconductor compound. The access lines, 203-1A, 203-1B, 203-2A, 203-2B . . . , 203-QA, 203-QB, may respectively correspond to word lines and plate lines described in connection with FIG. 1A.

As shown in the example embodiment of FIG. 2, a conductive body contact 295 may be formed extending in the first direction (D1) 209 along an end surface of the transistors 215-A in each level (L1) 213-1, (L2) 213-2, and (L3) 213-P above the substrate 200. The body contact 295 may be connected to a body (e.g., body region) of the transistors 215-A, 215-B. The body contact 295 may include a conductive material such as, for example, one of a doped semiconductor material, a conductive metal nitride, metal, and/or a metal-semiconductor compound, among others.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 is a perspective view illustrating a portion of a semiconductor device in accordance with a number of embodiments of the present disclosure. A unit cell (e.g., memory cell 110 in FIG. 1A) of the vertically stacked array of memory cells (e.g., within a sub cell array 101-2 in FIG. 1A) according to some embodiments of the present disclosure is illustrated in FIG. 3.

The source/drain region 321 of the transistor 315-A, the source/drain region 324 of the transistor 315-B, and the shared source/drain region 323 of the transistors 315-A, 315-B may be impurity doped regions.

As shown in FIG. 3, the source/drain region 321 and the shared source/drain region 323 may be separated by a channel 325 formed in a body of semiconductor material (e.g., a body region 326, of the transistors 315). The source/drain region 324 and the shared source/drain region 323 may be separated by a channel 327 formed in a body of semiconductor material (e.g., a body region 326, of the transistors 315). The source/drain regions, 321 323, and 324 may be formed from an n-type or p-type dopant doped in the body region 326. Embodiments are not so limited.

For example, for an n-type conductivity transistor construction the body region 326 of the transistors 315 may be formed of a low doped (p−) p-type semiconductor material. In one embodiment, the body region 326 and the channels 325, 327 respectively separating the source/drain regions, 321 323, 324 may include a low doped, p-type (e.g., low dopant concentration (p−)) polysilicon material consisting of boron (B) atoms as an impurity dopant to the semiconductor material (e.g., polycrystalline silicon, among others). The source/drain regions, 321 323, 324 may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

The source/drain regions 321, 323, 324 may include a high dopant concentration, n-type conductivity impurity (e.g., high dopant (n+) or (n++)) doped in the source/drain regions 321, 323, 324. In some embodiments, the high dopant, n-type conductivity source/drain regions 321, 323, 324 may include a high concentration of Phosphorus (P) atoms deposited therein. Embodiments, however, are not limited to this example. In other embodiments, the transistors 315 may be of a p-type conductivity construction in which case the impurity, e.g., dopant, conductivity types would be reversed.

As shown in the embodiment of FIG. 3, the source/drain regions 321, 323, 324 may occupy an upper portion in the body 326 of the transistors 315. For example, the source/drain region 321 may have a bottom surface 312 within the body 326 of the transistor 315 which is located higher, vertically in the third direction (D3) 311, than a bottom surface of the body 326 of the transistor 315. As such, the transistor 315 may have a body portion 326 which is below the source/drain region 321, as well as source/drain regions 323, 324. The body portion may be in electrical contact with a body contact (e.g., body contact 295 shown in FIG. 2). Further, as shown FIG. 3, a digit line 307-1 may disposed on a top surface 322-1 of the source/drain region 321 and electrically coupled thereto.

As shown in the embodiment of FIG. 3, a pair of access lines 303-1A, 303-1B, may be vertically extending in the third direction (D3) 311 and respectively adjacent sidewalls of the channel regions 325, 327. A gate dielectric material 304-1, 304-2 may be interposed between the access line 303-1A, 303-1B (a portion thereof forming a gate to the transistors 330-A, 330-B) and the channel regions 325, 327. The gate dielectric material 304-1, 304-2 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304-1, 304-2 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

FIG. 4A is a cross-sectional view, at one stage of a semiconductor device fabrication process in accordance with a number of embodiments of the present disclosure.

Figure 4:
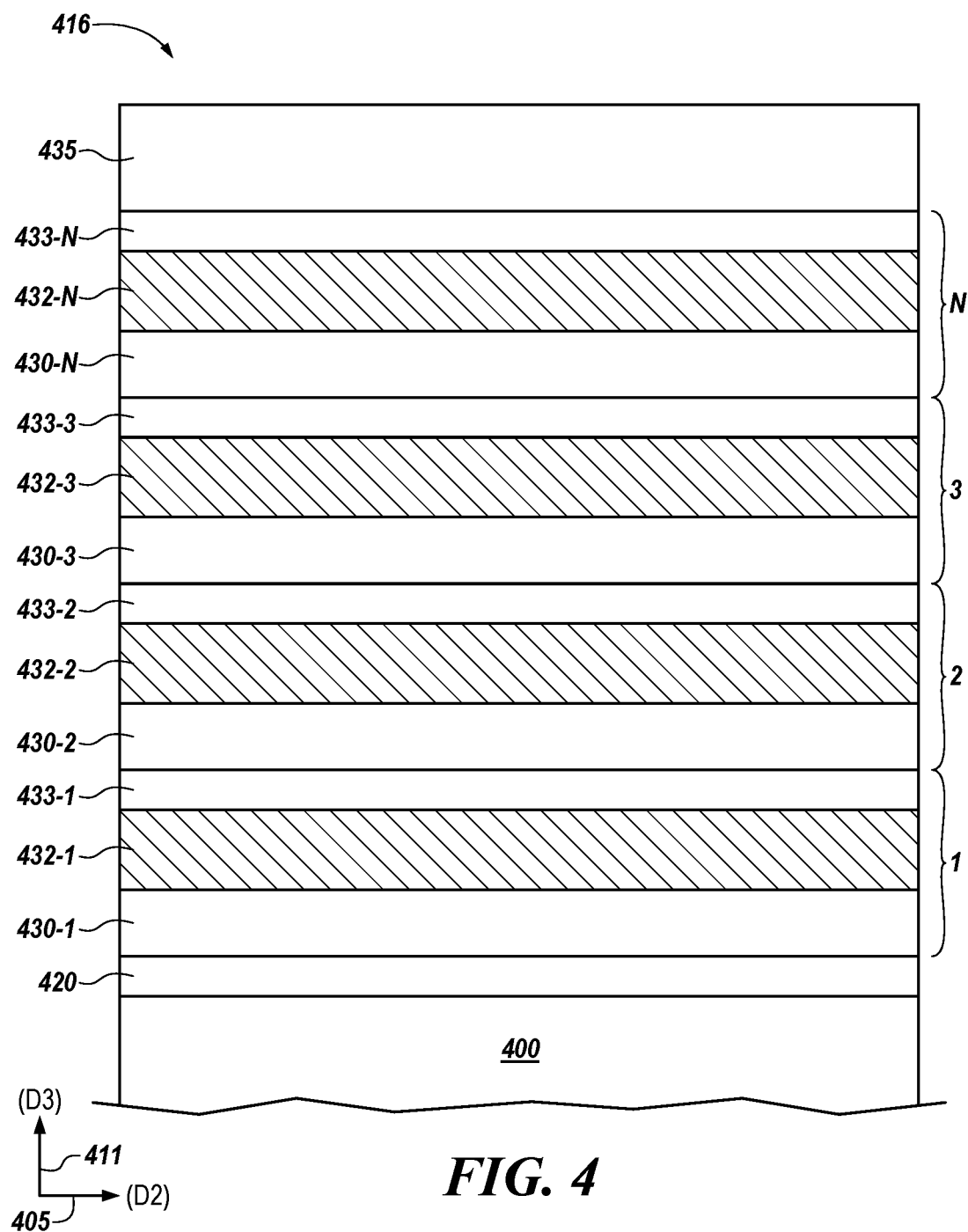
FIG. 4 is a cross-sectional view, at one stage of a semiconductor device fabrication process in accordance with a number of embodiments of the present disclosure.

In the embodiment shown in FIG. 4, a semiconductor device fabrication process comprises depositing alternating layers of a first dielectric material, 430-1, 430-2, . . . , 430-N (collectively referred to as first dielectric material 430), a semiconductor material, 432-1, 432-2, . . . , 432-N (collectively referred to as semiconductor material 432), and a second dielectric material, 433-1, 433-2, . . . , 433-N (collectively referred to as second dielectric 433), in repeating iterations to form a vertical stack 416 on a working surface of a substrate 400. The alternating materials in the repeating, vertical stack 416 may be separated from the substrate 400 by an insulator material 420. In one embodiment, the first dielectric material 430 can be deposited to have a thickness, e.g., vertical height in the third direction (D3), in a range of twenty (20) nanometers (nm) to sixty (60) nm. In one embodiment, the semiconductor material 432 can be deposited to have a thickness, e.g., vertical height, in a range of twenty (20) nm to one hundred (100) nm. In one embodiment, the second dielectric material 433 can be deposited to have a thickness, e.g., vertical height, in a range of ten (10) nm to thirty (30) nm. Embodiments, however, are not limited to these examples. As shown in FIG. 4, a vertical direction 411 is illustrated as a third direction (D3), e.g., z-direction in an x-y-z coordinate system.

In some embodiments, the first dielectric material, 430-1, 430-2, . . . , 430-N, may be an interlayer dielectric (ILD). By way of example, and not by way of limitation, the first dielectric material, 430-1, 430-2, . . . , 430-N, may comprise an oxide material, e.g., $SiO_2$. In another example the first dielectric material, 430-1, 430-2, . . . , 430-N, may comprise a silicon nitride ($Si_3N_4$) material (also referred to herein as "SiN"). In another example the first dielectric material, 430-1, 430-2, . . . , 430-N, may comprise a silicon oxy-carbide ($SiO_xC_y$) material. In another example the first dielectric material, 430-1, 430-2, . . . , 430-N, may include silicon oxy-nitride ($SiO_xN_y$) material (also referred to herein as "SiON"), and/or combinations thereof. Embodiments are not limited to these examples.

In some embodiments the semiconductor material, 432-1, 432-2, . . . , 432-N, may comprise a silicon (Si) material in a polycrystalline and/or amorphous state. The semiconductor material, 432-1, 432-2, ..., 432-N, may be a low doped, p-type (p−) silicon material. The semiconductor material, 432-1, 432-2, ..., 432-N, may be formed by gas phase doping boron atoms (B), as an impurity dopant, at a low concentration to form the low doped, p-type (p−) silicon material. The low doped, p-type (p−) silicon material may be a polysilicon material. Embodiments, however, are not limited to these examples.

In some embodiments, the second dielectric material, 433-1, 433-2, ..., 433-N, may be an interlayer dielectric (ILD). By way of example, and not by way of limitation, the second dielectric material, 433-1, 433-2, ..., 433-N, may comprise a nitride material. The nitride material may be a silicon nitride ($Si_3N_4$) material (also referred to herein as "SiN"). In another example the second dielectric material, 433-1, 433-2, ..., 433-N, may comprise a silicon oxycarbide (SiOC) material. In another example the second dielectric material, 433-1, 433-2, ..., 433-N, may include silicon oxy-nitride (SiON), and/or combinations thereof. Embodiments are not limited to these examples. However, according to embodiments, the second dielectric material, 433-1, 433-2, ..., 433-N, is purposefully chosen to be different in material or composition than the first dielectric material, 430-1, 430-2, ..., 430-N, such that a selective etch process may be performed on one of the first and second dielectric layers, selective to the other one of the first and the second dielectric layers, e.g., the second SiN dielectric material, 433-1, 433-2, ..., 433-N, may be selectively etched relative to the semiconductor material, 432-1, 432-2, ..., 432-N, and a first oxide dielectric material, 430-1, 430-2, ..., 430-N.

The repeating iterations of alternating first dielectric material, 430-1, 430-2, ..., 430-N layers, semiconductor material, 432-1, 432-2, ..., 432-N layers, and second dielectric material, 433-1, 433-2, ..., 433-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a first dielectric material, a semiconductor material, and a second dielectric material, in repeating iterations to form the vertical stack 416.

The layers may occur in repeating iterations vertically. In the example of FIG. 4, three tiers, numbered 1, 2, and 3, of the repeating iterations 1-N are shown. For example, the stack 416 may include: a first dielectric material 430-1, a semiconductor material 432-1, a second dielectric material 433-1, a third dielectric material 430-2, a second semiconductor material 432-2, a fourth dielectric material 433-2, a fifth dielectric material 430-3, a third semiconductor material 432-3, and a sixth dielectric material 433-3. As such, a stack may include: a first oxide material 430-1, a first semiconductor material 432-1, a first nitride material 433-1, a second oxide material 430-2, a second semiconductor material 432-2, a second nitride material 433-2, a third oxide material 430-3, a third semiconductor material 432-3, and a third nitride material 433-3 in further repeating iterations. Embodiments, however, are not limited to this example and more or fewer repeating iterations may be included.

Figure 5A:
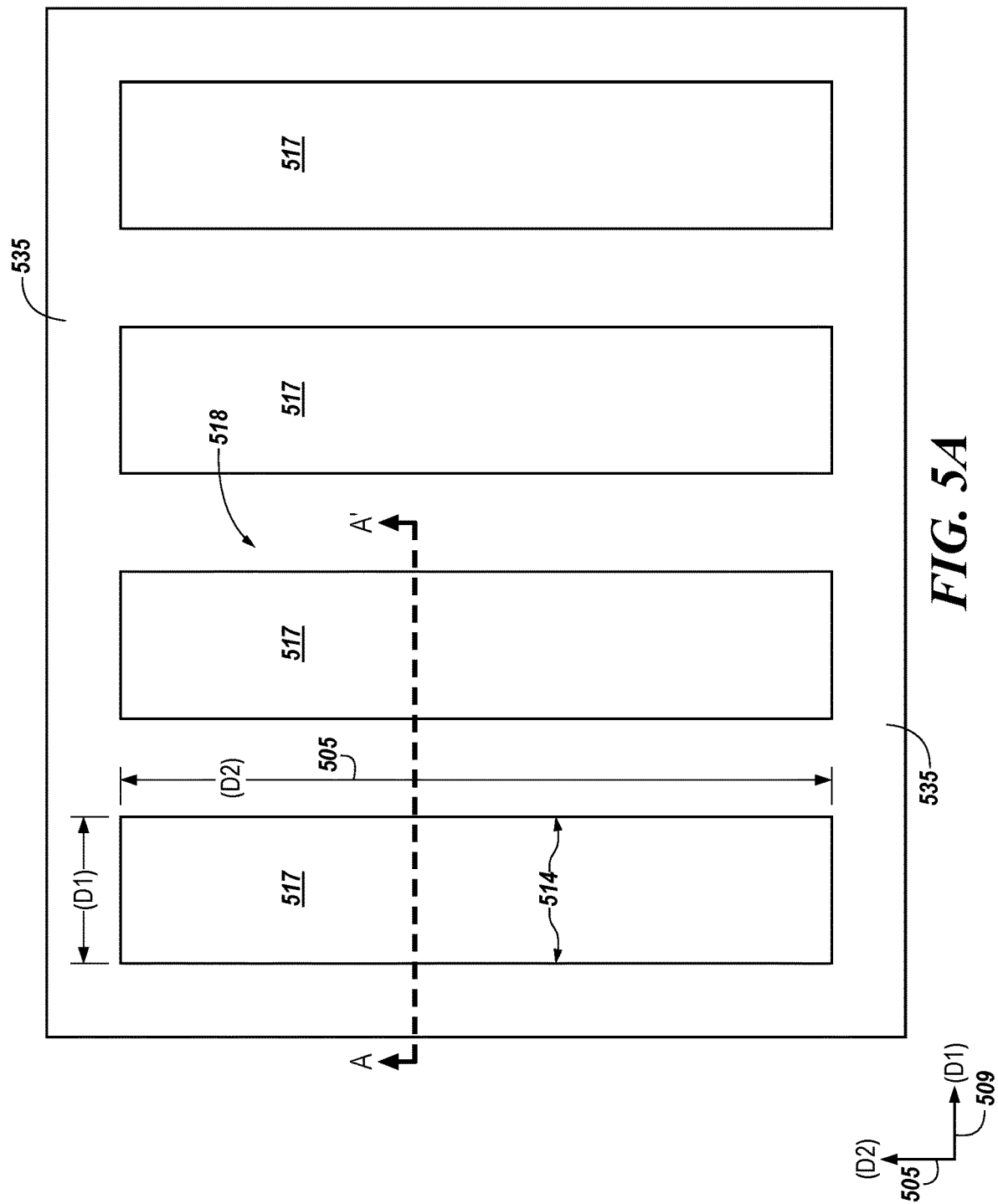
FIG. 5A is a view of a semiconductor device in fabrication, at one stage of a semiconductor device fabrication process in accordance with a number of embodiments of the present disclosure.

FIG. 5A is a view of a semiconductor device in fabrication, at one stage of a semiconductor device fabrication process in accordance with a number of embodiments of the present disclosure.

FIG. 5A illustrates a top-down view of a semiconductor device structure, at a particular point in time, in a semiconductor device fabrication process, according to one or more embodiments. In the example embodiment shown in the example of FIG. 5A, the semiconductor device fabrication process comprises using an etchant process to form a plurality of first vertical openings 517, having a first horizontal direction (D1) 509 and a second horizontal direction (D2) 505, through the vertical stack to the substrate. In one example, as shown in FIG. 5A, the plurality of first vertical openings 517 are extending predominantly in the second horizontal direction (D2) 505 and may form elongated vertical, pillar columns 518 with sidewalls 514 in the vertical stack. The plurality of first vertical openings 517 may be formed using photolithographic techniques to pattern a photolithographic mask 535, e.g., to form a hard mask (HM), on the vertical stack prior to etching the plurality of first vertical openings 517.

FIG. 5B is a cross-sectional view, taken along cut-line A-A' in FIG. 5A. The cross-sectional view shown in FIG. 5B shows the repeating iterations of alternating layers of a first dielectric material, 530-1, 530-2, ..., 530-N, a semiconductor material, 532-1, 532-2, ..., 532-N, and a second dielectric material, 533-1, 533-2, ..., 533-N, on a semiconductor substrate 500 and including an insulator 520. FIG. 5B illustrates that a conductive material, 540-1, 540-2, ..., 540-4, may be formed on a gate dielectric material 504 in the plurality of first vertical openings 517. By way of example and not by way of limitation, a gate dielectric material 504 may be conformally deposited in the plurality of first vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 504 may be deposited to a particular thickness (t1) as suited to a particular design rule (e.g., a gate dielectric thickness of approximately 10 nanometers (nm), among other values). Embodiments, however, are not limited to this example. By way of example, and not by way of limitation, the gate dielectric 504 may comprise a silicon dioxide ($SiO_2$) material, aluminum oxide ($Al_2O_3$) material, high dielectric constant (k), e.g., high-k, dielectric material, and/or combinations thereof.

As shown in FIG. 5B, the conductive material, 540-1, 540-2, ..., 540-4, may be conformally deposited in the plurality of first vertical openings 517 on a surface of the gate dielectric material 504. By way of example, and not by way of limitation, the conductive material, 540-1, 540-2, ..., 540-4, may be conformally deposited in the plurality of first vertical openings 517 on a surface of the gate dielectric material 504 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 504. The conductive material, 540-1, 540-2, ..., 540-4, may be conformally deposited to a particular thickness (t2) to form vertically oriented access lines (e.g., a number of which may correspond to 103-1A and 103-1B, 103-2A and 103-2B, ..., 103-QA and 103-QB shown in FIG. 1A) and can be suited to a particular design rule. For example, the conductive material, 540-1, 540-2, ..., 540-4, may be conformally deposited to a thickness of approximately 20 nanometers (nm), among other values. Embodiments, however, are not limited to this example. By way of example, and not by way of limitation, the conductive material, 540-1, 540-2, ..., 540-4, may comprise one or more of a doped semiconductor (e.g., doped silicon, doped germanium, etc.), a conductive metal nitride (e.g., titanium nitride, tantalum nitride, etc.), a metal (e.g., tungsten (W), titanium (Ti), tantalum (Ta), ruthenium (Ru), cobalt (Co), molybdenum (Mo), etc.), and/or a metal-semiconductor compound (e.g., tungsten silicide, cobalt silicide, titanium silicide, etc,) and/or some other combination thereof.

As shown in FIG. 5B, the conductive material, 540-1, 540-2, . . . , 540-4, may be recessed back to remain only along the vertical sidewalls of the elongated vertical, pillar columns, which are shown as 542-1, 542-2, and 542-3 in FIG. 5B. The plurality of separate, vertical access lines formed from the conductive material, 540-1, 540-2, . . . , 540-4, may be recessed back by using a suitable selective, anisotropic etch process remove the conductive material, 540-1, 540-2, . . . , 540-4, from a bottom surface of the first vertical openings (e.g., 517 in FIG. 5A) exposing the gate dielectric 504 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the first vertical openings 517, using a process such as CVD, to fill the first vertical openings 517. The dielectric may be planarized to a top surface of the hard mask 535 of the vertical semiconductor stack, using chemical mechanical planarization (CMP) or other suitable semiconductor fabrication technique. A subsequent photolithographic material 536 (e.g., hard mask) may be deposited using CVD and planarized using CMP to cover and close the first vertical openings 517 over the separate, vertical access lines, 540-1, 540-2, . . . , 540-4. Similar semiconductor process techniques may be used at other points of the semiconductor fabrication device process herein.

FIG. 6A is a view of a semiconductor device in fabrication, at one stage of a semiconductor device fabrication process in accordance with a number of embodiments of the present disclosure. FIG. 6A illustrates a top down view of a semiconductor structure, at a particular point in time, in a semiconductor devive fabrication process, according to one or more embodiments. In the example embodiment of FIG. 6A, the fabrication comprises using a photolithographic process to pattern the photolithographic mask 636, 536 in FIG. 5B. FIG. 6A illustrates using a selective, isotropic etchant process remove portions of the exposed conductive material, 640-1, 640-2, . . . , 640-N, 640-(N+1), . . . , 640-(Z−1), and 640-Z, to separate and individually form the plurality of separate, vertical access lines, 640-1, 640-2, . . . , 640-N, 640-(N+1), . . . , 640-(Z−1), and 640-Z E (e.g., a number of which may correspond to 103-1A and 103-1B, 103-2A and 103-2B, . . . , 103-QA and 103-QB shown in FIG. 1A). Hence the plurality of separate, vertical access lines, 640-1, 640-2, . . . , 640-N, 640-(N+1), . . . , 640-(Z−1), and 640-Z, are shown along the sidewalls of the elongated vertical, pillar columns 642-1, 642-2, . . . 642-N (e.g., along sidewalls of the elongated vertical, pillar columns 542-1, 542-2, and 542-3 in the cross-sectional view of FIG. 5B).

As shown in the example of FIG. 6A, the exposed conductive material, 640-1, 640-2, . . . , 640-N, 640-(N+1), . . . , 640-(Z−1), and 640-Z, may be removed back to the gate dielectric material 604 in the first vertical openings (e.g., 517 in FIG. 5A) using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 640-1, 640-2, . . . , 640-N, 640-(N+1), . . . , 640-(Z−1), and 640-Z, was removed using a process such as CVD, or other suitable technique. The dielectric material 641 may be planarized to a top surface of the previous hard mask 635 of the vertical semiconductor stack (e.g., vertical stack 416 as shown in FIG. 4) using a process such as CMP, or other suitable technique. In some embodiments, a subsequent photolithographic material (e.g., hard mask 637 shown in FIG. 6B) may, may be deposited using CVD and planarized using CMP to cover and close the plurality of separate, vertical access lines, 640-1, 640-2, . . . , 640-N, 640-(N+1), . . . , 640-(Z−1), and 640-Z, (e.g., a number of which may correspond to 103-1A and 103-1B, 103-2A and 103-2B, . . . , 103-QA and 103-QB shown in FIG. 1A) over a working surface of the vertical semiconductor stack, leaving the plurality of separate, vertical access lines, 640-1, 640-2, . . . , 640-N, 640-(N+1), . . . , 640-(Z−1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A. FIG. 6B shows another view of the semiconductor structure at a particular point in one example of semiconductor device fabrication process. The cross sectional view shown in FIG. 6B is away from the plurality of separate, vertical access lines, 640-1, 640-2, . . . , 640-N, 640-(N+1), . . . , 640-(Z−1) (e.g., a number of which may correspond to 103-1A and 103-1B, 103-2A and 103-2B, . . . , 103-QA and 103-QB shown in FIG. 1A), and shows the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N on a semiconductor substrate 600 including insulator 620. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the embodiment of FIG. 6B, the dielectric material 641 is shown filling the vertical openings on the residual gate dielectric 604 deposition. The hard mask 637 caps the illustrated structure.

FIG. 6C illustrates a cross sectional view, taken along cut-line B-B' in FIG. 6A. FIG. 6C shows another view of the semiconductor structure at a particular point in one example of semiconductor device fabrication process. The cross sectional view shown in FIG. 6C is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, along and in which the horizontally oriented transistors (e.g., 115-A and 115-B shown in FIG. 1A) can be formed within the layers of semiconductor material, 632-1, 632-2, . . . , 632-N. In FIG. 6C, a pair of vertical access lines 603-1A, 603-1B (e.g., corresponding to conductive materials 640, previously mentioned) is illustrated by a dashed line indicating a location set in from the plane and orientation of the drawing sheet.

FIG. 6D illustrates a cross sectional view, taken along cut-line C-C' in FIG. 6A. FIG. 6D shows another view of the semiconductor structure at a particular point in one example of semiconductor device fabrication process. The cross sectional view shown in FIG. 6D is illustrated extending in the second direction (D2) 605 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, outside of a region in which the horizontally oriented transistors and horizontally oriented storage nodes, e.g., capacitor cells, will be formed within the layers of semiconductor material, 632-1, 632-2, . . . , 632-N. In FIG. 6D, the dielectric material 641 is shown filling the vertical openings from another perspective. At the left end of the drawing sheet is shown the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, at which location a horizontally oriented digit line (e.g., digit lines 107-1, 107-2, . . . , 107-P shown in FIG. 1A) can be integrated to form electrical contact with the source/drain regions of a transistor (e.g., transistor 115-A shown in FIG. 1A) or digit line conductive contact material, described in more detail below.

FIG. 6E illustrates a cross sectional view, taken along cut-line D-D' in FIG. 6A. FIG. 6E shows another view of the semiconductor structure at a particular point in one example of semiconductor device fabrication process. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-N, a semiconductor material, 632-1, 632-2, . . . , 632-N, and a second dielectric material, 633-1, 633-2, . . . , 633-N, intersecting across the plurality of separate, vertical access lines, 640-1, 640-2, . . . , 640-N, 640-(N+1), . . . , 640-(Z−1), and intersecting regions of the semiconductor material, 632-1, 632-2, . . . , 632-N, in which a channel region may be formed, separated from the plurality of separate, vertical access lines, 640-1, 640-2, . . . , 640-N, 640-(N+1), . . . , 640-(Z−1) (e.g., a number of which may correspond to 103-1A and 103-1B, 103-2A and 103-2B, . . . , 103-QA and 103-QB shown in FIG. 1A), by the gate dielectric 604. In FIG. 6E, the first dielectric fill material 639 is shown separating the space between neighboring horizontally oriented transistors, which may be formed extending into and out from the plane of the drawing sheet and can be spaced along a first direction (D1) 609 and stacked vertically in arrays extending in the third direction (D3) 611 in the 3D memory.

FIG. 7A illustrates a cross sectional view, taken along cut-line B-B' in FIG. 6A. FIG. 7A shows another view of the semiconductor structure at a particular point in one example of semiconductor device fabrication process. The cross sectional view shown in FIG. 7A is illustrated extending in the second direction (D2) 705 along an axis of the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, along and in which the horizontally oriented transistors (e.g., 115-A and 115-B shown in FIG. 1A) can be formed within the layers of semiconductor material, 732-1, 732-2, . . . , 732-N. In FIG. 7A, a pair of vertical access lines 703-1A, 703-1B (e.g., corresponding to conductive materials 640, previously mentioned) is illustrated by a dashed line indicating a location set in from the plane and orientation of the drawing sheet.

FIG. 7B illustrates a cross sectional view, taken along cut-line A-A' in FIG. 6A. FIG. 7B shows another view of the semiconductor structure at a particular point in one example of semiconductor device fabrication process.

In the example of FIG. 7B, the semiconductor device fabrication process comprises using a photolithographic process to pattern one or more photolithographic masks (e.g., 735, 536, and/or 637). One or more etchant processes can be utilized to form a vertical opening 771 and vertical opening 728. The vertical openings 771 and the vertical openings 728 may be formed concurrently or sequentially. The one or more etchant processes forms vertical opening 771 and vertical opening 728 to expose third sidewalls in the repeating iterations of alternating layers of a first dielectric material, 730-1, 730-2, . . . , 730-N, a semiconductor material, 732-1, 732-2, . . . , 732-N, and a second dielectric material, 733-1, 733-2, . . . , 733-N, in the vertical stack. The vertical opening 771 and vertical opening 728 may be utilized for transistor formation (e.g., in regions of an elongated vertical, pillar column 742). The one or more etchant processes may comprise an anisotropic etching process.

Figure 7C:
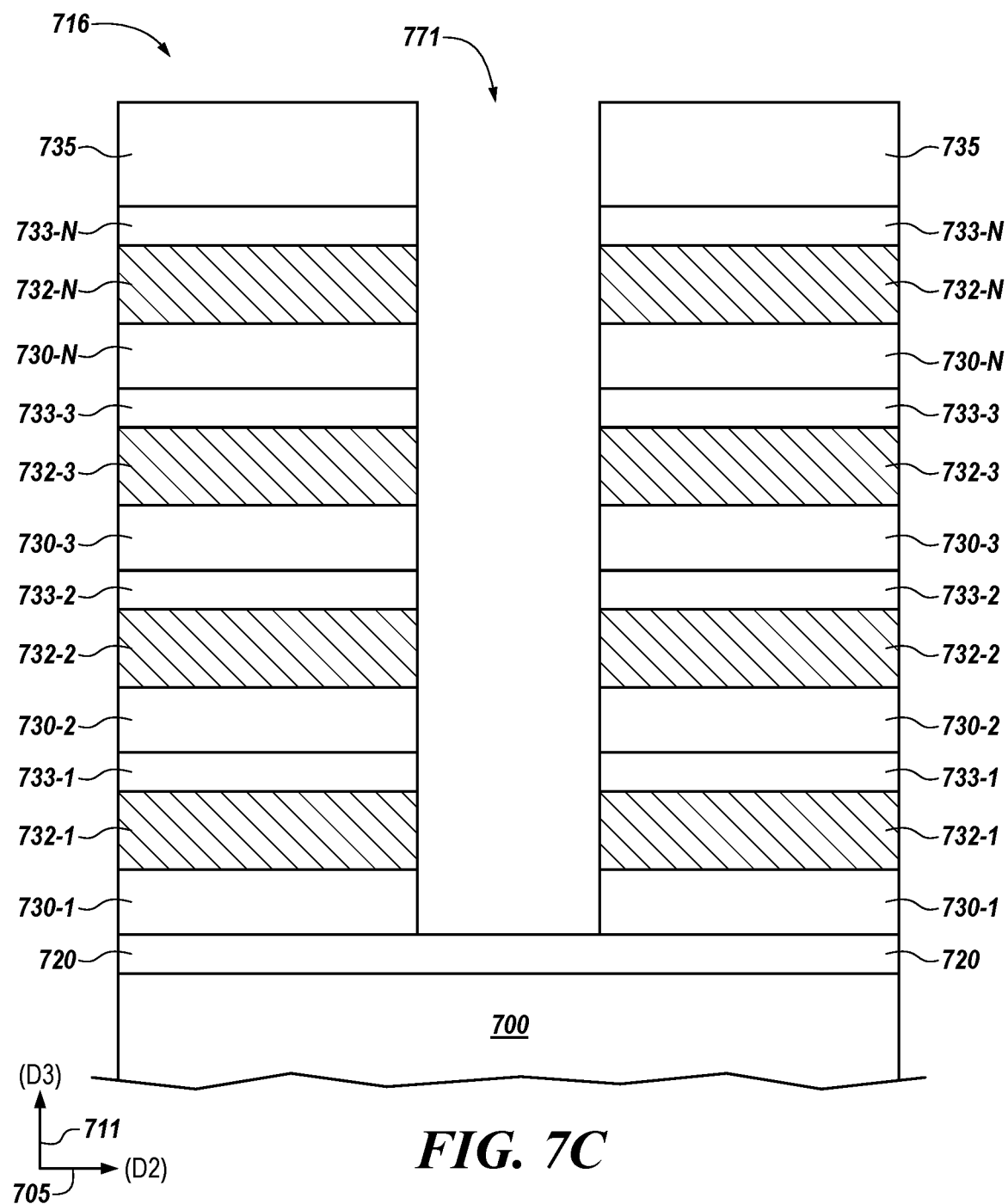
FIG. 7C is a cross-sectional view, at one stage of a semiconductor device fabrication process in accordance with a number of embodiments of the present disclosure.

FIG. 7C is a cross-sectional view, at one stage of a semiconductor device fabrication process in accordance with a number of embodiments of the present disclosure. FIG. 7C shows another view of the semiconductor structure at a particular point in one example of semiconductor device fabrication process.

FIG. 7C illustrates the vertical opening 771 in the vertical stack 716 on a working surface of a semiconductor substrate 700 and including an insulator 720. The vertical opening 771 extends in the vertical direction 711. Multiple second vertical openings 771 (as well as vertical opening 728 shown in FIG. 7B) may be formed through the layers of materials. The second vertical opening 771 and the vertical opening 728 (shown in FIG. 7B) may be formed to expose vertical sidewalls in the vertical stack 701. While FIG. 7C illustrates the vertical opening 771 through which source/drain region 721 (shown in FIG. 7E) and conductive material 777 (shown in FIG. 7F) are formed, analogous processes, as discussed herein, can be performed through vertical opening 728 (shown in FIG. 7B) to form another source/drain region (e.g., source/drain region 324 shown in FIG. 3) and another conductive material (e.g., source line 106, 206, 306 respectively shown in FIGS. 1-3).

Figure 7D:
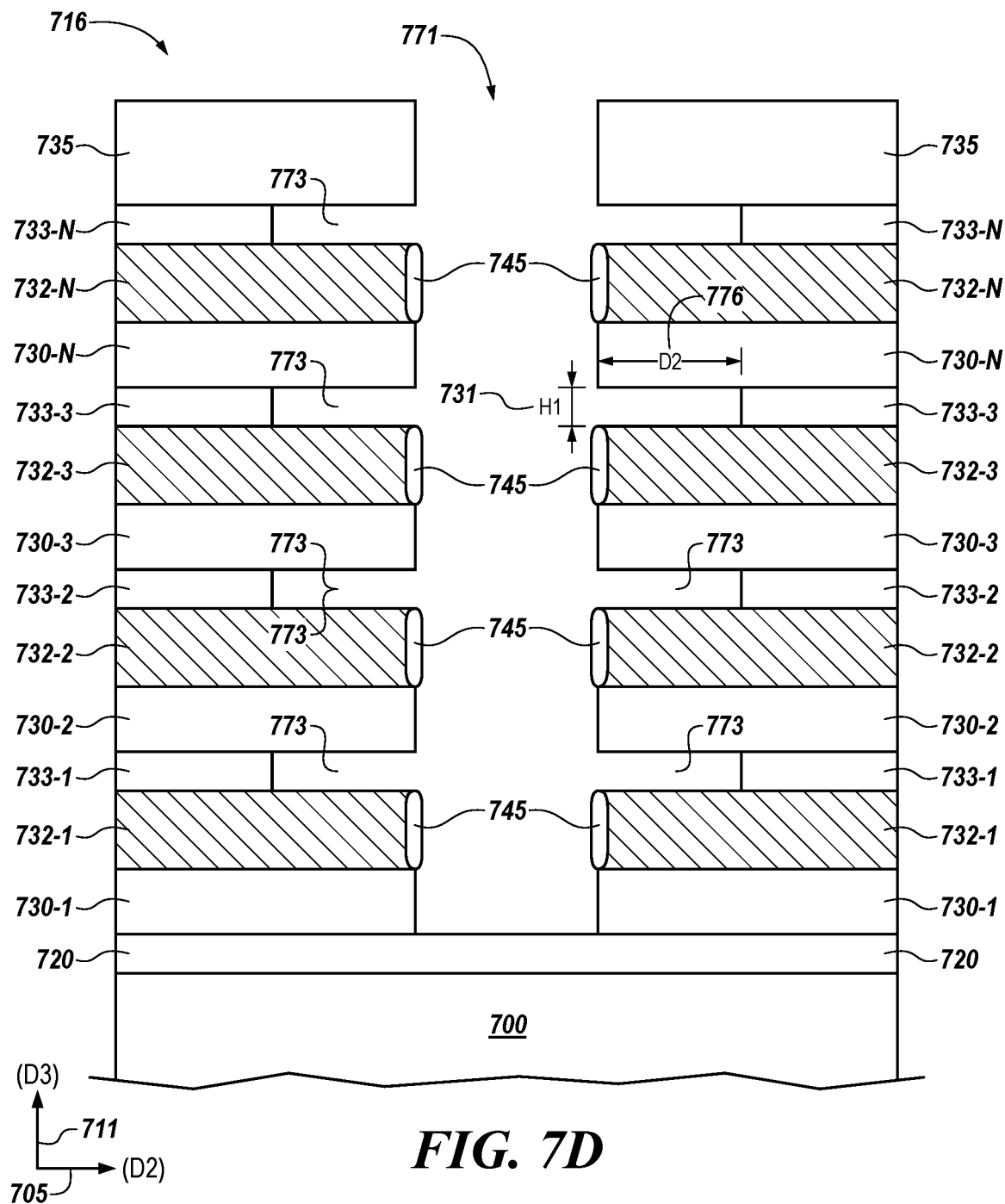
FIG. 7D is a cross-sectional view, at one stage of a semiconductor device fabrication process in accordance with a number of embodiments of the present disclosure.

FIG. 7D is a cross-sectional view, at one stage of a semiconductor device fabrication process in accordance with a number of embodiments of the present disclosure. FIG. 7D shows another view of the semiconductor structure at a particular point in one example of semiconductor device fabrication process.

As shown in FIG. 7D, a selective etchant process may etch the second dielectric material 733 to form a horizontal opening 773 (while not shown in FIG. 7D, a same selective etch process, as well as other processes discussed herein, may be performed via the vertical opening 728, as shown in FIG. 7B). The selective etchant process may be performed such that the horizontal opening 773 has a length or depth (e.g., a distance (DIST 2) 776 from the second vertical opening 771; this distance may similarly also be utilized through the vertical opening 728). The distance (DIST 2) 776 may be controlled by controlling time, composition of etchant gas, and etch rate of a reactant gas flowed into the second vertical opening 771, e.g., rate, concentration, temperature, pressure, and time parameters. As such, the second dielectric material 733 may be etched a second distance (DIST 2) 776 from the second vertical opening 771 (e.g., from the sidewalls of the stack 716). The selective etch may be isotropic, but selective to the second dielectric material 733, substantially stopping on the first dielectric material 730 and the semiconductor material 732. Thus, in one example embodiment, the selective etchant process may remove substantially all of the second dielectric material 733 from a top surface of the semiconductor material 732 to a bottom surface of the first dielectric material 730 (e.g., oxide material) in a layer above while etching horizontally the distance (DIST 2) 776 from the second vertical opening 771 between the semiconductor material 732 and the first dielectric material 730. In this example the horizontal opening 773 will have a height (H1) 731 substantially equivalent to and be controlled by a thickness, to which the second dielectric layer 733 (e.g., nitride material) was deposited. Embodiments, however, are not limited to this example. As described herein, the selective etchant process may etch the second dielectric material 733 to a second distance (DIST 2) 776 and to a height (H1) 731.

Selective etchant process utilized herein may consist of one or more etch chemistries selected from an aqueous etch chemistry, a semi-aqueous etch chemistry, a vapor etch chemistry, or a plasma etch chemistries, among other possible selective etch chemistries. For example, a dry etch chemistry of oxygen ($O_2$) or $O_2$ and sulfur dioxide ($SO_2$) ($O_2/SO_2$) may be utilized. A dry etch chemistries of $O_2$ or of $O_2$ and nitrogen ($N_2$)($O_2/N_2$) may be used. Alternatively, or in addition, a selective etch may comprise a selective etch chemistry of phosphoric acid ($H3PO_4$) or hydrogen fluoride (HF) and/or dissolving a material (e.g., a portion of dielectric material 733) using a selective solvent, for example $NH_4OH$ or HF, among other possible etch chemistries or solvents. As an example, the etchant process may cause an oxidization of only the dielectric material 733 (e.g., a nitride material). As shown in the example of FIG. 7D, the etchant process may form a protective oxide coating, e.g., second oxide material 745, on the semiconductor material 732. Hence, the first dielectric material 730 and the semiconductor material 732 may be left intact during a selective etchant process. For example, a selective etchant process may etch a portion of the dielectric material 733 (e.g., a nitride material), while not removing the dielectric material 730 (e.g., an oxide material) or the semiconductor material 732.

As noted, the semiconductor material 732 may be protected by a oxide material 745 formed on the semiconductor material 732 during a selective etchant process. The oxide material 745 may be present on all iterations of the semiconductor material 732. For example, the oxide material 745 may be present on a sidewall to the first semiconductor material 732-1, the second semiconductor material 732-2, and the third semiconductor material 732-3, etc., in the vertical opening 771 (as will as vertical opening 728) within the stack 716.

While not shown in FIG. 7D, a number of embodiments provide that the second dielectric material 733 can be selectively horizontally etched a distance greater than the distance (DIST 2) 776 from the second vertical opening 771 (or from the vertical opening 728 shown in FIG. 7B), for example. Selectively etching the second dielectric material 733 the distance greater than the distance (DIST 2) 776 can provide access to a region of semiconductor material 732 to be gas phased doped for the formation of a shared source/drain region, such as shared source/drain region 323 shown in FIG. 3. Referring again to FIG. 3, the shared source/drain region 323 is located between the source/drain region 321 and the source/drain region 324 in the horizontal direction (D2) 305. After the region of semiconductor material 732 has gas phased doped for the formation of the shared source/drain region (e.g., shared source/drain region 323), additional second dielectric material 733 can be deposited (e.g., to the second vertical opening 771). Following the additional deposition of the additional second dielectric material 733, the second dielectric material 733 can be selectively horizontally etched the distance (DIST 2) 776, as previously discussed. Alternatively, the shared source/drain region 323 may be formed by deposition of select materials during formation of the vertical stack (e.g., vertical stack 416 shown in FIG. 4). Further, prior to depositing the second dielectric material 433 shown in FIG. 4, a doping process may be performed on the semiconductor material 432 to form the shared source/drain region.

A number of embodiments provide that the source/drain regions 321, 324 and the shared source drain region 323 (as shown in FIG. 3, for example) may be formed by gas phase doping a dopant into a top surface portion of the semiconductor material 732 via horizontal openings via the vertical openings 771 and/or 728. Gas phase doping may be used to achieve a highly isotropic e.g., non-directional doping. In another example, thermal annealing with doping gas, such as phosphorous may be used with a high energy plasma assist to break the bonding. Embodiments are not so limited and other suitable semiconductor fabrication techniques may be utilized. The source/drain regions discussed herein may be formed by gas phase doping phosphorus (P) atoms, as impurity dopants, at a high plasma energy such as PECVD to form a high concentration, n-type doped (n+) region in the top surface of the semiconductor material 732, for example.

Figure 7E:
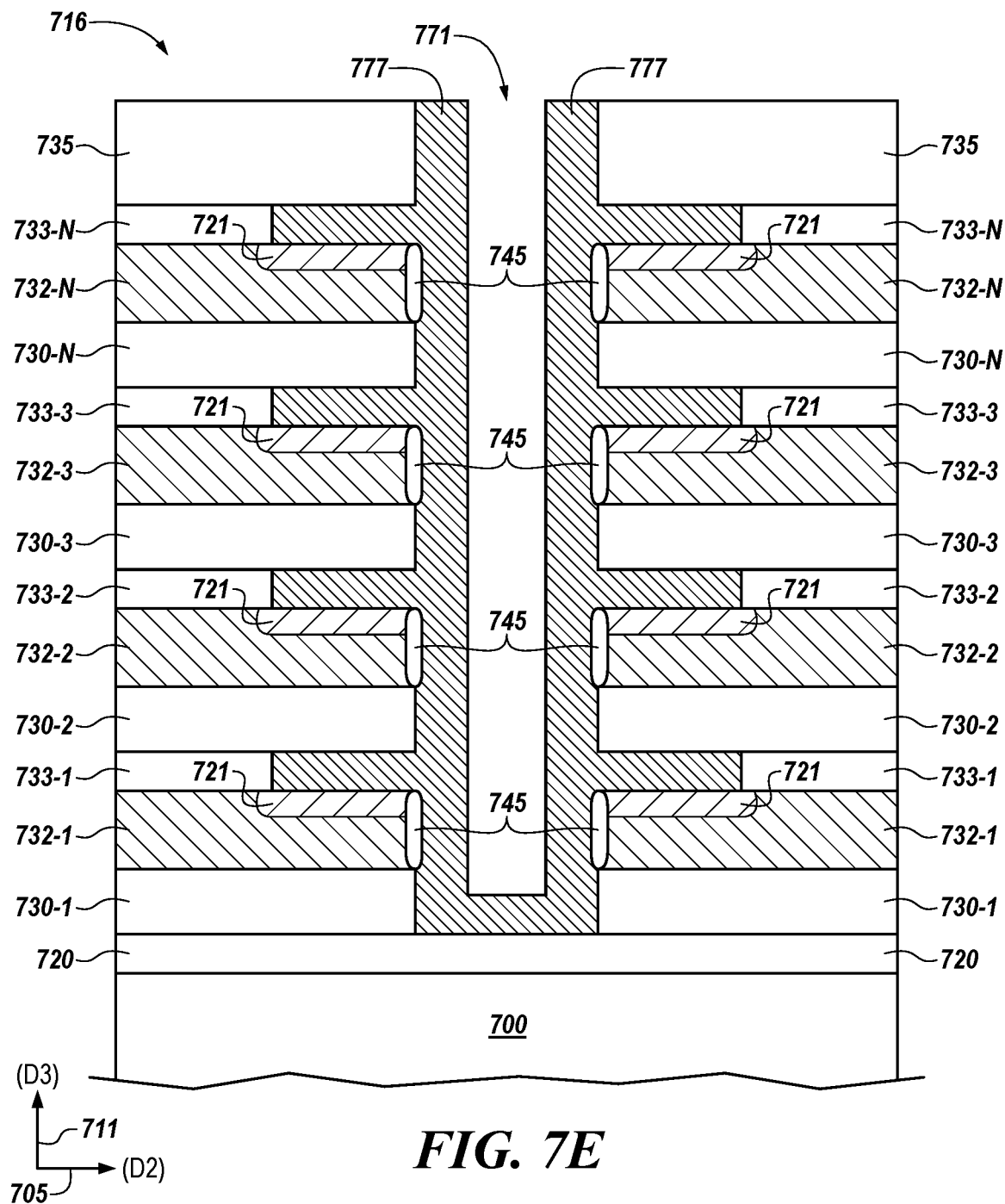
FIG. 7E is a cross-sectional view, at one stage of a semiconductor device fabrication process in accordance with a number of embodiments of the present disclosure.

FIG. 7E is a cross-sectional view, at one stage of a semiconductor device fabrication process in accordance with a number of embodiments of the present disclosure. FIG. 7E shows another view of the semiconductor structure at a particular point in one example of semiconductor device fabrication process.

As show in FIG. 7E, a source/drain region 721 may be formed by gas phase doping a top region of the semiconductor material 732. Further, as shown in FIG. 7E, a conductive material 777 may be deposited into a portion of the second vertical opening 771 (e.g., using a chemical vapor deposition (CVD) process) such that the conductive material 777 may also be deposited into the horizontal opening 773 (shown in FIG. 7D). The conductive material 777 may be formed to be in contact with source/drain region 721. In some embodiments, the conductive material 777 may comprise a titanium nitride (TiN) material. In some embodiments the conductive material 777 may be tungsten (W). In this example, some embodiments may include forming the tungsten (W) material according to a method as described U.S. patent application Ser. No. 16/943,108, entitled "Digit Line Formation for Horizontally Oriented Access Devices. The conductive material 777 may form a laterally (e.g., horizontally) oriented digit line (e.g., 107, 207, 307 shown in FIGS. 1-3). As shown in FIG. 7E, an oxide material 745 may be utilized to protect sidewalls of the semiconductor material 7321 in second vertical opening 771.

Figure 7F:
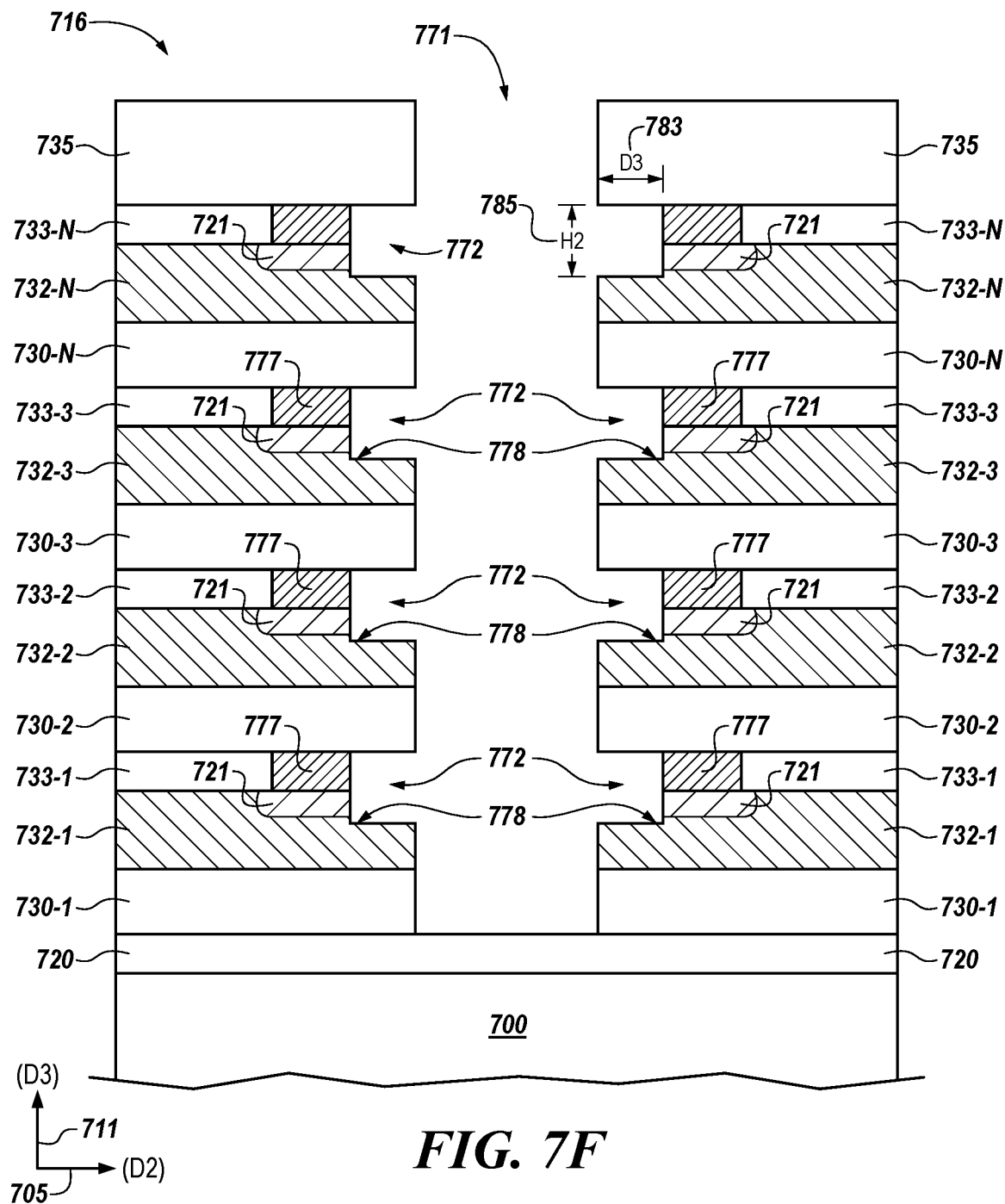
FIG. 7F is a cross-sectional view, at one stage of a semiconductor device fabrication process in accordance with a number of embodiments of the present disclosure.

FIG. 7F is a cross-sectional view, at one stage of a semiconductor device fabrication process in accordance with a number of embodiments of the present disclosure. FIG. 7F shows another view of the semiconductor structure at a particular point in one example of semiconductor device fabrication process.

As shown in FIG. 7F, the oxide material 745 is removed (e.g., selectively etched away). A portion of the source/drain region 721, and a first portion 778 of the semiconductor material beneath the source/drain region 721 may be selectively etched away to allow for formation of a body contact, in the vertical opening 771, to a body region of the horizontal transistor; alternatively, the vertical opening 771 may be filled with another material (e.g., a dielectric material). In this example, the conductive material 777, a portion of the source/drain region 721 and a top portion (e.g., first portion 778 of the semiconductor material 732 beneath the source/drain region 721) may also be etched back to a third distance (DIST 3) 783 from the second vertical opening 771. The etch may be performed using an etchant process, e.g., using an atomic layer etching (ALE) or other suitable technique. In some embodiments, the source/drain region 721 may be etched to the same horizontal distance (DIST 3) 783 from the second vertical opening 771 as the conductive material 777.

Thus, a horizontal opening 772 may be formed by the etching the portion of the source/drain region 721 and the top surface (e.g., 778) of the semiconductor material 732 beneath the source/drain region 721 the third horizontal distance (DIST 3) 783 from the second vertical opening 771. As such, the horizontal openings 772 may have a vertical height (H2) 785. The vertical height (H2) 785 may be greater (e.g., taller vertically) than a combination of the height (H1) 731 of the horizontal opening 773 formed in the second dielectric material (e.g., nitride material) and the height (e.g., depth of gas phase doping into the top surface of the semiconductor material 732), of the source/drain region 721. For example, the vertical height (H2) 785 may also include a height of the top portion (e.g., 778) of the semiconductor material 732 that was etched away. Thus, the distance (DIST 3) 783 may be shorter than the distance (DIST 2) 776, but the vertical height (H2) 785 may be taller than the height (shown as H1 in FIG. 7D).

Figure 7G:
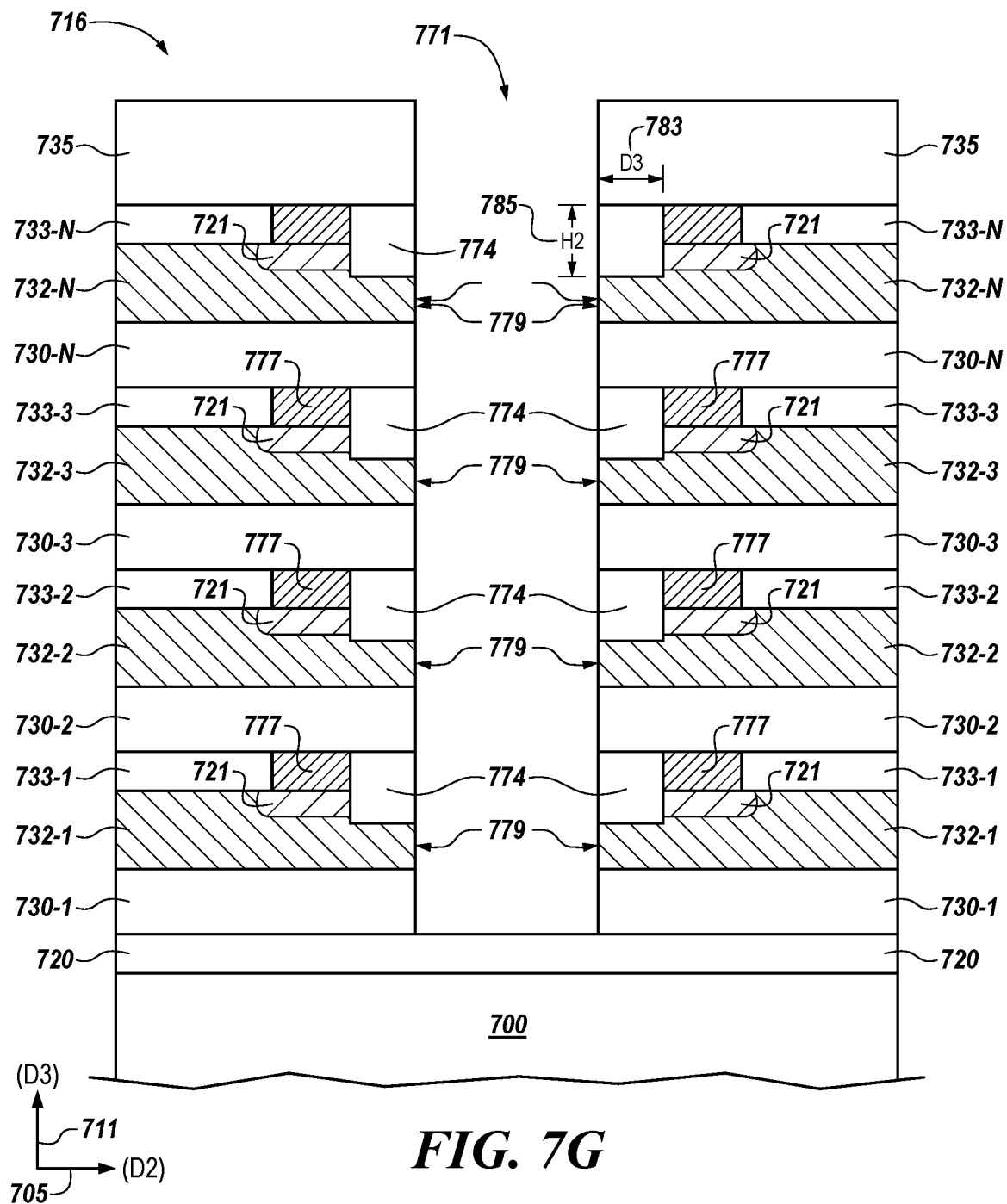
FIG. 7G is a cross-sectional view, at one stage of a semiconductor device fabrication process in accordance with a number of embodiments of the present disclosure.

FIG. 7G is a cross-sectional view, at one stage of a semiconductor device fabrication process in accordance with a number of embodiments of the present disclosure. FIG. 7G shows another view of the semiconductor structure at a particular point in one example of semiconductor device fabrication process.

As shown in FIG. 7G, a dielectric material 774 may be deposited into the second vertical opening 771. The dielectric material 774 may fill the vertical opening 771; or, the dielectric material may be recessed back (as shown in FIG. 7G) to remove the dielectric material 774 from the second vertical opening 771 and maintain the second vertical opening 771 to allow for deposition of a conductive material (e.g., 295 shown in FIG. 2; not shown in FIG. 7G) to form a direct, electrical contact between such conductive material deposited within the second vertical opening 771 and a second portion 779 of the semiconductor material 732 (e.g., body region contact) of the horizontally oriented transistor (e.g., 215-A in FIG. 2) within the vertical stack 716. In some embodiments, the dielectric material 774 may be etched away from the second vertical opening 771 to expose the sidewalls of the first dielectric material 730, the dielectric material 774, and a second portion 779 of the semiconductor material 732.

Figure 8A:
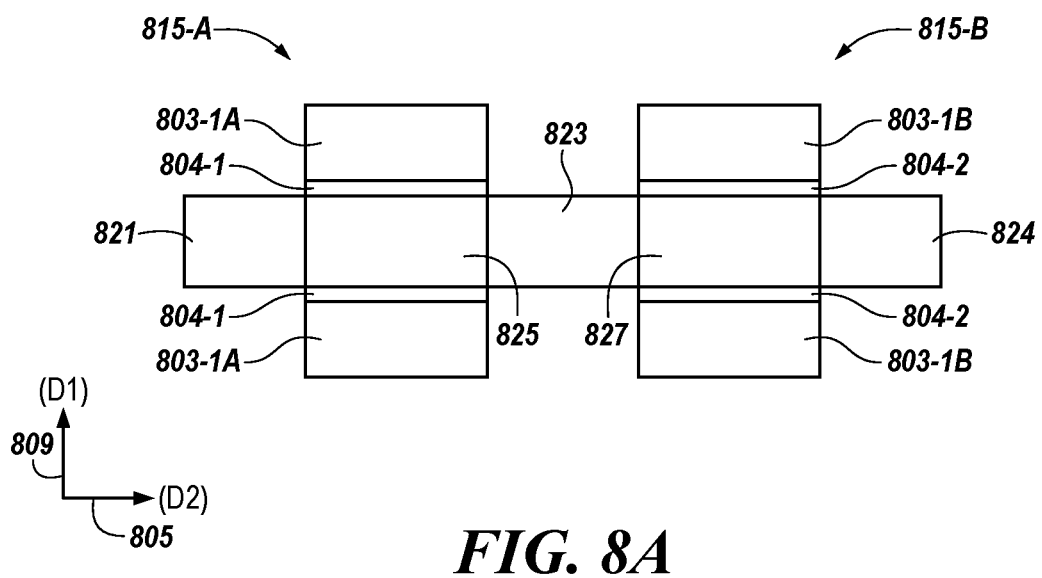
FIG. 8A is a view illustrating a portion of a semiconductor device in accordance with a number of embodiments of the present disclosure.

FIG. 8A is a view illustrating a portion of a semiconductor device in accordance with a number of embodiments of the present disclosure. FIG. 8A illustrates the first transistor 815-A and the second transistor 815-B extending in the horizontal direction (D2) 805 (e.g., are horizontally oriented transistors).

As shown in FIG. 8A, the two transistor cell includes the source/drain region 821, the shared source/drain region 823, and the source/drain region 824, where the source/drain region 821 and the shared source/drain region 823 are separated by the channel region 825 and the shared source/drain region 823 and the source/drain region 824 are separated by the channel region 827. The gate dielectric material 804-1, 804-2 is respectively interposed between the access lines 803-1A and 803-1B. As shown in FIG. 8A, the first transistor 815-A and the second transistor 815-B are serially connected.

Embodiments of the present disclosure provide that the shared second source/drain region 823 can be an undoped (e.g., intrinsic) semiconductor material, a n-type doped semiconductor material (e.g., a low concentration n-type doped semiconductor material or a high concentration n-type doped semiconductor material), or a p-type doped semiconductor material (e.g., a low concentration p-type doped semiconductor material or a high concentration p-type doped semiconductor material).

One or more embodiments of the present disclosure provide that the channel regions 825, 827 have a different type of doping than the shared second source/drain region 823. For instance, if the channel regions 825, 827 have n-type doping, the shared second source/drain region 823 may have p-type doping.

One or more embodiments of the present disclosure provide that the channel regions 825, 827 have a different concentration of doping than the shared second source/drain region 823. For instance, if the channel regions 825, 827 have (n+) type doping, the shared second source/drain region 823 may have (n++) doping.

Figure 8B:
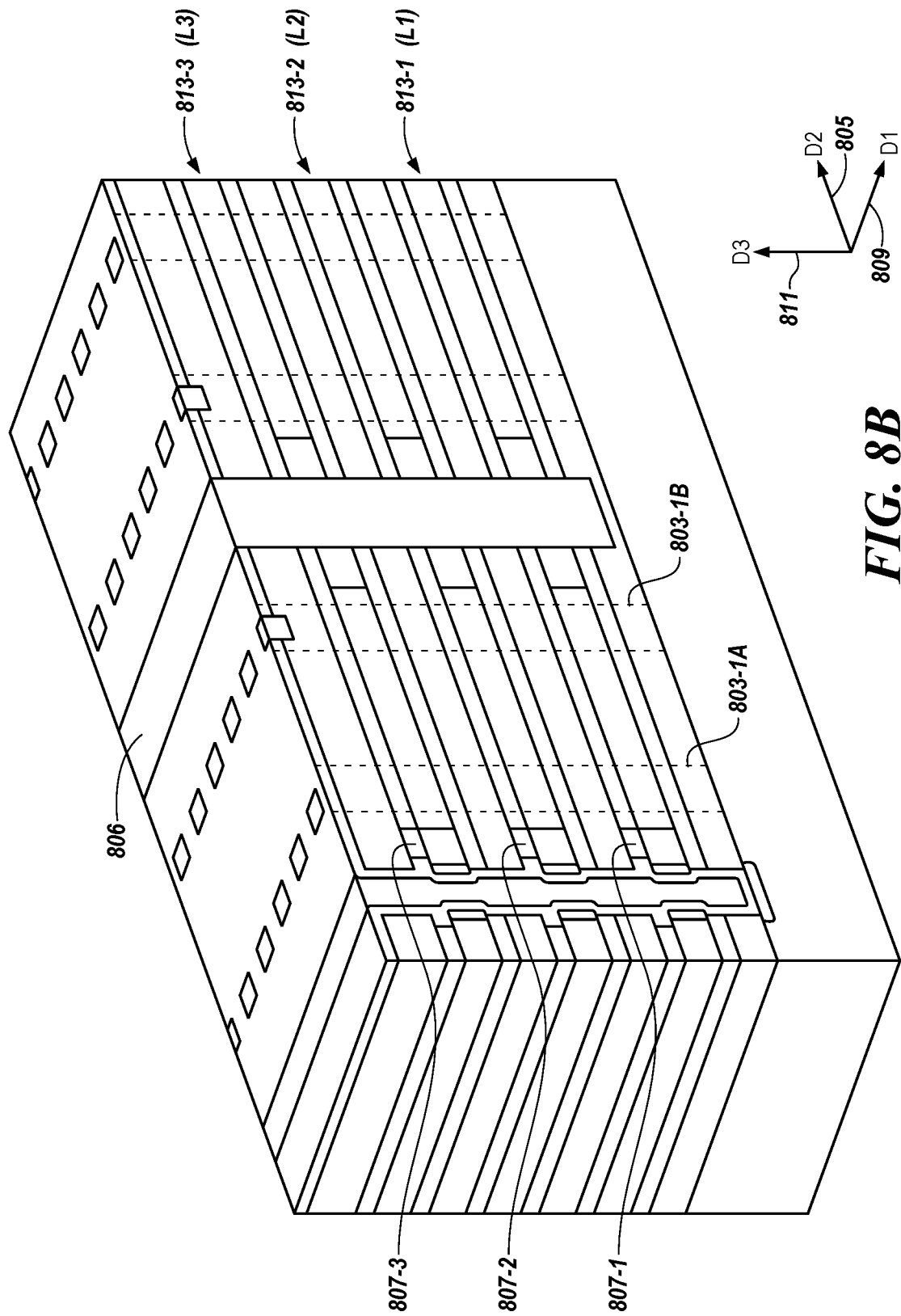
FIG. 8B is a view illustrating a portion of a semiconductor device in accordance with a number of embodiments of the present disclosure.

FIG. 8B is a view illustrating a portion of a semiconductor device in accordance with a number of embodiments of the present disclosure. FIG. 8B shows the access lines 803-1A, 803-1B associated with the serially connected transistor (e.g., the first transistor 815-A and the second transistor 815-B shown in FIG. 8A).

As shown in FIG. 8B, the source line 806 is shared by (e.g., common to) memory cells coupled to different digit lines 807-1, 807-2, 807-3. As shown in FIG. 8B, the source line 806 is common to memory cells of the first level 813-1 (L1), the second level 813-2 (L2), and the third level 813-3 (L3). While the source line 806 is common to memory cells of three levels, embodiments are not so limited; the source line 806 may be common to memory cells of various numbers of levels.

Figure 9:
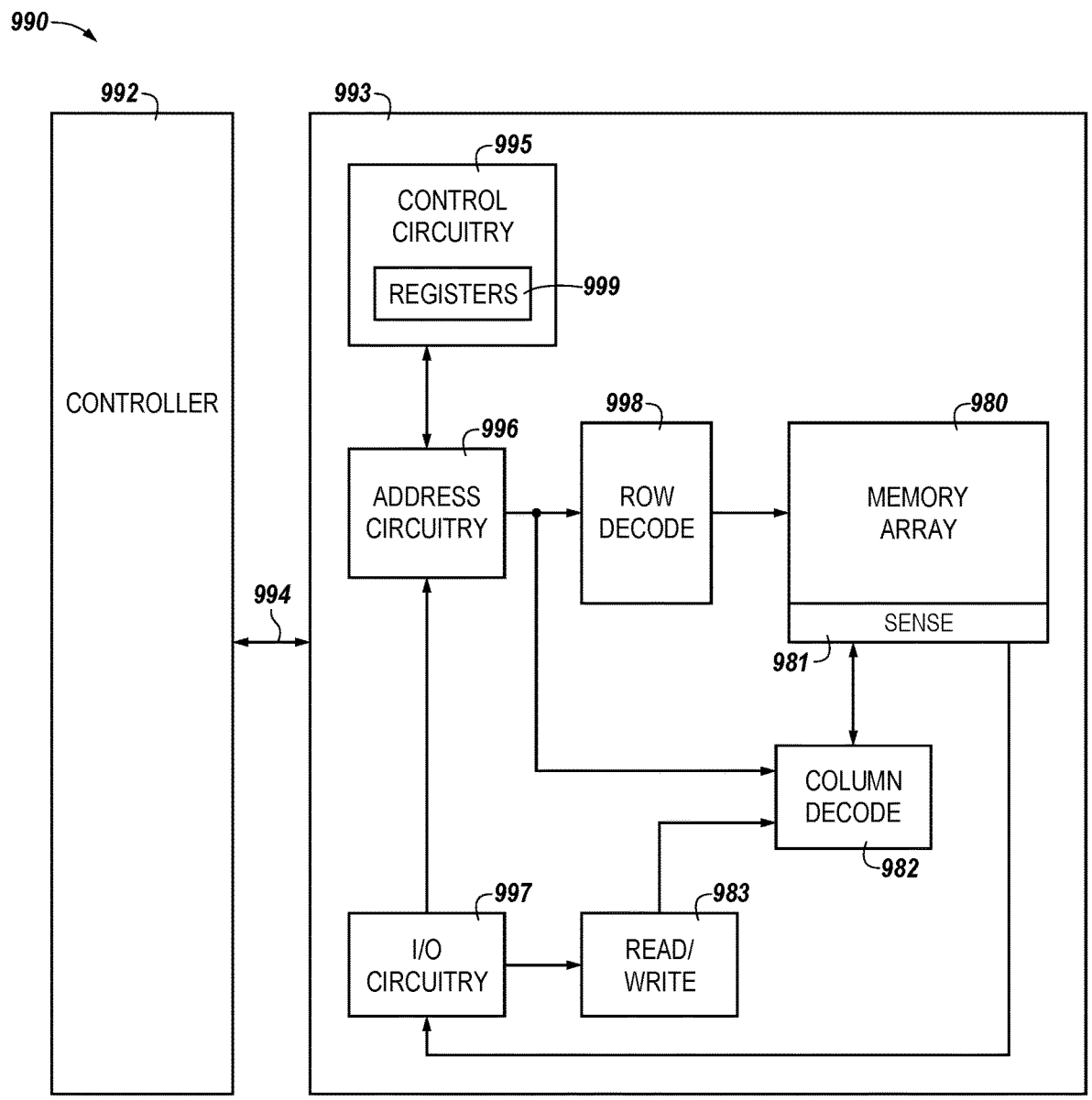
FIG. 9 is a block diagram of an apparatus in the form of a computing system including a memory device, in accordance with a number of embodiments of the present disclosure.

FIG. 9 is a block diagram of an apparatus in the form of a computing system including a memory device, in accordance with a number of embodiments of the present disclosure. FIG. 9 is a block diagram of an apparatus in the form of a computing system 990 including a memory device 993 in accordance with a number of embodiments of the present disclosure. As used herein, a memory device 993, a memory array 980, and/or a host 992, for example, might also be separately considered an "apparatus." According to embodiments, the memory device 993 may comprise at least one memory array 980 with a memory cell formed having a digit line and body contact, according to the embodiments described herein.

In this example, system 990 includes a host 992 coupled to memory device 993 via an interface 994. The computing system 990 can be a personal laptop computer, a desktop computer, a digital camera, a mobile telephone, a memory card reader, or an Internet-of-Things (IoT) enabled device, among various other types of systems. Host 992 can include a number of processing resources (e.g., one or more processors, microprocessors, or some other type of controlling circuitry) capable of accessing the memory device 993. The system 990 can include separate integrated circuits, or both the host 992 and the memory device 993 can be on the same integrated circuit. For example, the host 992 may be a system controller of a memory system comprising multiple memory devices 993, with the control circuitry 995 providing access to the respective memory devices 993 by another processing resource such as a central processing unit (CPU).

In the example shown in FIG. 9, the host 992 is responsible for executing an operating system (OS) and/or various applications (e.g., processes) that can be loaded thereto (e.g., from memory device 993 via control circuitry 995). The OS and/or various applications can be loaded from the memory device 993 by providing access commands from the host 992 to the memory device 993 to access the data comprising the OS and/or the various applications. The host 992 can also access data utilized by the OS and/or various applications by providing access commands to the memory device 993 to retrieve said data utilized in the execution of the OS and/or the various applications.

For clarity, the system 990 has been simplified to focus on features with particular relevance to the present disclosure. The memory array 980 can be a DRAM array comprising at least one memory cell having a digit line and, in a number of embodiments, a body contact formed according to the techniques described herein. For example, the memory array 980 can be an unshielded DL 4F2 array such as a 3D-DRAM memory array. The memory array 980 can comprise memory cells arranged in rows coupled by access lines and columns coupled by digit lines and source lines. Although a single array 980 is shown in FIG. 9, embodiments are not so limited. For instance, memory device 993 may include a number of arrays 980 (e.g., a number of banks of DRAM cells).

The memory device 993 includes address circuitry 996 to latch address signals provided over the interface 994. The interface can include, for example, a physical interface employing a suitable protocol (e.g., a data bus, an address bus, and a command bus, or a combined data/address/command bus). Such protocol may be custom or proprietary, or the interface 994 may employ a standardized protocol, such as Peripheral Component Interconnect Express (PCIe), Gen-Z, CCIX, or the like. Address signals are received and decoded by a row decoder 998 and a column decoder 982 to access the memory array 980. Data can be read from memory array 980 by sensing voltage and/or current changes on the sense lines using sensing circuitry 981. The sensing circuitry 981 can comprise, for example, sense amplifiers that can read and latch a page (e.g., row) of data from the memory array 980. The I/O circuitry 997 can be used for bi-directional data communication with the host 992 over the interface 994. The read/write circuitry 983 is used to write data to the memory array 980 or read data from the memory array 980. As an example, the circuitry 983 can comprise various drivers, latch circuitry, etc.

Control circuitry 995 includes registers 999 and decodes signals provided by the host 992. The signals can be commands provided by the host 992. These signals can include chip enable signals, write enable signals, and address latch signals that are used to control operations performed on the memory array 980, including data read operations, data write operations, and data erase operations. In various embodiments, the control circuitry 995 is responsible for executing instructions from the host 992. The control circuitry 995 can comprise a state machine, a sequencer, and/or some other type of control circuitry, which may be implemented in the form of hardware, firmware, or software, or any combination of the three. In some examples, the host 992 can be a controller external to the memory device 993. For example, the host 992 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements. Unless stated otherwise, where a single element is discussed, it is understood that all similar elements are referred to.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming two transistor cells for vertical three-dimensional (3D) memory comprising:
 depositing layers of a first dielectric material, a semiconductor material, and a second dielectric material, in repeating iterations vertically to form a vertical stack on a substrate;
 forming a plurality of first vertical openings, having a first horizontal direction and a second horizontal direction, through the vertical stack and extending predominantly in the second horizontal direction to form elongated vertical, pillar columns with first vertical sidewalls in the vertical stack;
 conformally depositing a first conductive material on a gate dielectric material in the plurality of first vertical openings;
 removing portions of the first conductive material in the plurality of first vertical openings to form a plurality of separate, vertical access line pairs along the sidewalls of the elongated vertical, pillar columns, wherein:
  the pairs of vertically oriented access lines are orthogonal to the substrate;
  a first vertical access line pair is located between a horizontally oriented digit line and a second vertical access line pair, wherein the horizontally oriented digit line is parallel to the substrate; and
  the second vertical access line pair is located between the first vertical access line pair and a source line, wherein:
   an independent source/drain region of a first transistor of a memory cell is coupled to a respective horizontally oriented digit line and an independent source/drain region of a second transistor of the memory cell is coupled to a respective common source line;
   each respective common source line is parallel to the substrate; and
   each respective common source line is coupled to only a single row of memory cells;
 forming second vertical openings through the vertical stack and extending predominantly in the first horizontal direction to expose second vertical sidewalls adjacent first regions of the semiconductor material on opposite sides of the vertical access line pairs of the elongated vertical, pillar columns;
 selectively etching the second dielectric material to form first horizontal openings, wherein the second dielectric material is removed a first distance (DIST 1) horizontally back from the second vertical openings;
 gas phase doping a dopant in a top surface of the semiconductor material in the first horizontal openings to form source/drain regions;
 forming a conductive material onto the top surface above the source/drain regions in the first horizontal openings;
 selectively etching the conductive material, the source/drain regions and a first portion of a low doped semiconductor material beneath the source/drain regions to form second horizontal openings having a second distance (DIST 2) horizontally back from the second vertical openings; and
 depositing a third dielectric material in second horizontal openings laterally adjacent the conductive material and the source/drain regions.

2. The method of claim 1, wherein depositing layers of the first dielectric material, the semiconductor material, and the second dielectric material, in repeating iterations vertically to form a vertical stack, comprises:
 depositing an oxide material as the first dielectric material;
 depositing low doped, p-type (p−) polysilicon as the semiconductor material; and
 depositing a silicon nitride (SiN) material as the second dielectric material.

3. The method of claim 1, wherein the semiconductor material is undoped silicon.

4. The method of claim 1, wherein the semiconductor material is n-type polysilicon.

5. The method of claim 1, wherein the dopant is n-type dopant (n+) and the semiconductor material is a low doped, p-type (p−) semiconductor material.

6. The method of claim 4, wherein removing portions of the first conductive material in the plurality of first vertical openings to form the plurality of separate, vertical access line pairs along the sidewalls of the elongated vertical, pillar columns further comprises:
 gas phase doping exposed side surfaces between the plurality of separate, vertical access line pairs along the sidewalls of the elongated vertical, pillar columns with a n-type dopant (n++).

7. The method of claim 1, wherein depositing the conductive material comprises depositing a titanium/titanium nitride (TiN) conductive material, via the vertical opening, to form a titanium silicide as part of the horizontally oriented digit line to each of a plurality of horizontally oriented transistors.

8. The method of claim 1, wherein depositing the conductive material comprises depositing a metal containing material, via the vertical opening, to form the horizontally oriented digit line to each of a plurality horizontally oriented transistors.

9. The method of claim 8, wherein the metal containing material comprises a tungsten (W) composition or a ruthenium (Ru) composition.

10. The method of claim 8, further comprising:
 selectively etching the metal containing material the second distance horizontally back from the second vertical openings to remain above and in electrical contact with the source/drain regions; and
 selectively etching the metal containing material before selectively etching the first source/drain region and the first portion of the low doped semiconductor material beneath the first source/drain region to form the second horizontal opening, the second horizontal opening having a second height.

11. The method of claim 1, further comprising depositing a silicon nitride (SiN) material as the third dielectric.

12. The method of claim 1, further comprising etching the vertical stack to:
 maintain the first vertical opening; and
 expose sidewalls of the third dielectric material a second portion of the low doped semiconductor material and the second dielectric material.

13. The method of claim 1, further comprising:
 depositing a p-type dopant (p+) polysilicon material into second one of the first vertical openings to form a source line (SL).

14. A memory device, comprising:
 an array of vertically stacked two transistor (2T) memory cells on a substrate, the array of vertically stacked 2T memory cells, comprising:

serially connected horizontally oriented transistors each having an independent first source/drain region and a shared second source/drain region separated by channel regions, and gates opposing the channel regions and separated therefrom by a gate dielectric;

pairs of vertically oriented access lines separated from the channel region by the gate dielectric, wherein:

the pairs of vertically oriented access lines are orthogonal to the substrate;

a first pair of vertically oriented access lines is located between a horizontally oriented digit line and a second pair of vertically oriented access lines, wherein the horizontally oriented digit line is parallel to the substrate; and the second pair of vertically oriented access lines is located between the first pair of vertically oriented access lines and a common source line, wherein:

an independent source/drain region of a first transistor of a memory cell is coupled to a respective horizontally oriented digit line and an independent source/drain region of a second transistor of the memory cell is coupled to a respective common source line;

each respective common source line is parallel to the substrate; and each respective common source line is coupled to only a single row of memory cells; and the horizontally oriented digit lines electrically coupled to the first source/drain regions of the horizontally oriented transistors.

15. The memory device of claim 14, wherein the shared second source/drain region of the serially connected horizontally oriented transistors is an undoped semiconductor material, an n-type doped semiconductor material, or a p-type doped semiconductor material.

16. The memory device of claim 15, wherein the channel regions have a different type of doping than the shared second source/drain region of the serially connected horizontally oriented transistors.

17. The memory device of claim 15, wherein the channel regions have a different concentration of doping than the shared second source/drain region of the serially connected horizontally oriented transistors.

18. A memory device, comprising:

an array of vertically stacked two transistor (2T) memory cells on a substrate, the array of vertically stacked 2T memory cells, comprising:

serially connected horizontally oriented transistors each having an independent first source/drain region, a shared second source/drain region separated by channel regions, and gates opposing the channel regions and separated therefrom by a gate dielectric, and an independent third source/drain region;

pairs of vertically oriented access lines separated from the channel region by the gate dielectric, wherein:

the pairs of vertically oriented access lines are orthogonal to the substrate;

a first pair of vertically oriented access lines is located between a respective horizontally oriented digit line of a plurality of horizontally oriented digit lines and a second pair of vertically oriented access lines, wherein the plurality of horizontally oriented digit lines is parallel to the substrate; and the second pair of vertically oriented access lines is located between the first pair of vertically oriented access lines and a respective common source line of a plurality of common source lines, wherein each of the plurality of common source lines is parallel to the substrate;

the plurality of horizontally oriented digit lines electrically coupled to the first source/drain regions of the horizontally oriented transistors; and the plurality of horizontally oriented source lines electrically coupled to the third source/drain regions of the horizontally oriented transistors, wherein each of the plurality of horizontally oriented source lines is electrically coupled to only a single row of memory cells.

19. The memory device of claim 18, wherein the shared second source/drain region of the serially connected horizontally oriented transistors is an undoped semiconductor material, a n-type doped semiconductor material, or a p-type doped semiconductor material.

20. The memory device of claim 19, wherein the channel regions have a different type of doping than the shared second source/drain region of the serially connected horizontally oriented transistors.

21. The memory device of claim 19, wherein the channel regions have a different concentration of doping than the shared second source/drain region of the serially connected horizontally oriented transistors.

* * * * *